(12) United States Patent　　(10) Patent No.: US 7,091,753 B2
Inoshita　　(45) Date of Patent: Aug. 15, 2006

(54) GATE DRIVING CIRCUIT

(75) Inventor: Ryousuke Inoshita, Nishikamo-gun (JP)

(73) Assignee: Denso Corporation, Kariya (JP)

( * ) Notice: Subject to any disclaimer, the term of this patent is extended or adjusted under 35 U.S.C. 154(b) by 94 days.

(21) Appl. No.: 10/878,572

(22) Filed: Jun. 29, 2004

(65) Prior Publication Data

US 2005/0001659 A1　　Jan. 6, 2005

(30) Foreign Application Priority Data

Jul. 2, 2003　(JP)　............................. 2003-270430
Mar. 31, 2004　(JP)　............................. 2004-106095

(51) Int. Cl.
*H03K 3/00*　(2006.01)
(52) U.S. Cl. ...................... 327/108; 327/112
(58) Field of Classification Search ......... 327/108–112
See application file for complete search history.

(56) References Cited

U.S. PATENT DOCUMENTS

| 5,010,261 A | 4/1991 | Steigerwald | 327/404 |
| 5,089,719 A | 2/1992 | Kamei et al. | 327/109 |
| 5,140,201 A | 8/1992 | Uenishi | 327/108 |
| 5,204,561 A | 4/1993 | Rischmüller | 327/427 |
| 5,264,736 A | 11/1993 | Jacobson | 327/365 |
| 6,441,673 B1 | 8/2002 | Zhang | 327/423 |
| 6,911,848 B1 * | 6/2005 | Vinciarelli | 327/108 |

FOREIGN PATENT DOCUMENTS

| JP | A-3-60360 | 3/1991 |
| JP | A-2000-59195 | 2/2000 |
| JP | A-2001-314075 | 11/2001 |

OTHER PUBLICATIONS

Mr. Maksimovic, Institute of Electrical and Electronics Engineers: "A MOS Gate Drive With Resonant Transitions" Proceedings of the Annual Power Electronics Specialists Conference, vol. Conf. 22,24, Jun. 1991, pp. 527-532.

* cited by examiner

*Primary Examiner*—Kenneth B. Wells
(74) *Attorney, Agent, or Firm*—Posz Law Group, PLC

(57) ABSTRACT

In a gate driving circuit, when a driving target device is turned on, an auxiliary driving element is turned on to form a closed circuit comprising a DC power source, a reactor, an auxiliary driving element and an OFF-driving element, and make reactor current flow in the direction from a power source intermediate point to an output point in advance. Just before the driving target device is turned on, the OFF-driving element is turned off to form a resonance circuit comprising the reactor, the auxiliary driving element and the gate capacitance, and make gate current (reactor current) flow so that the gate capacitance is charged by using resonance phenomenon of the resonance circuit.

7 Claims, 28 Drawing Sheets

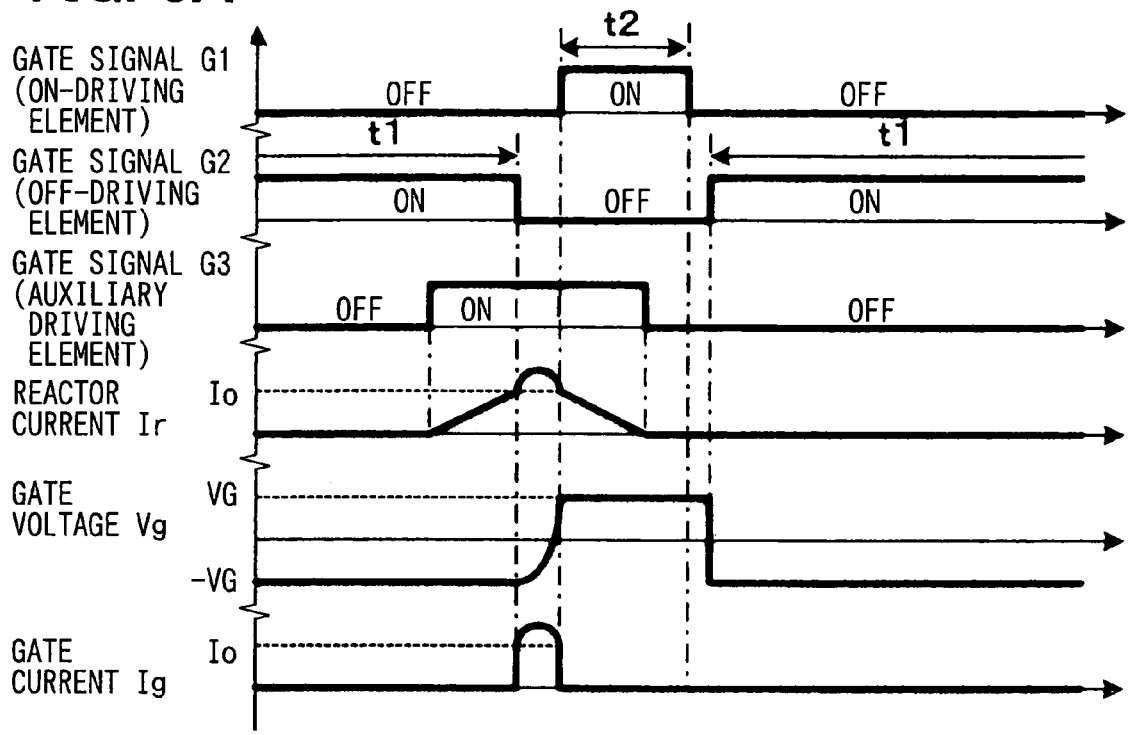
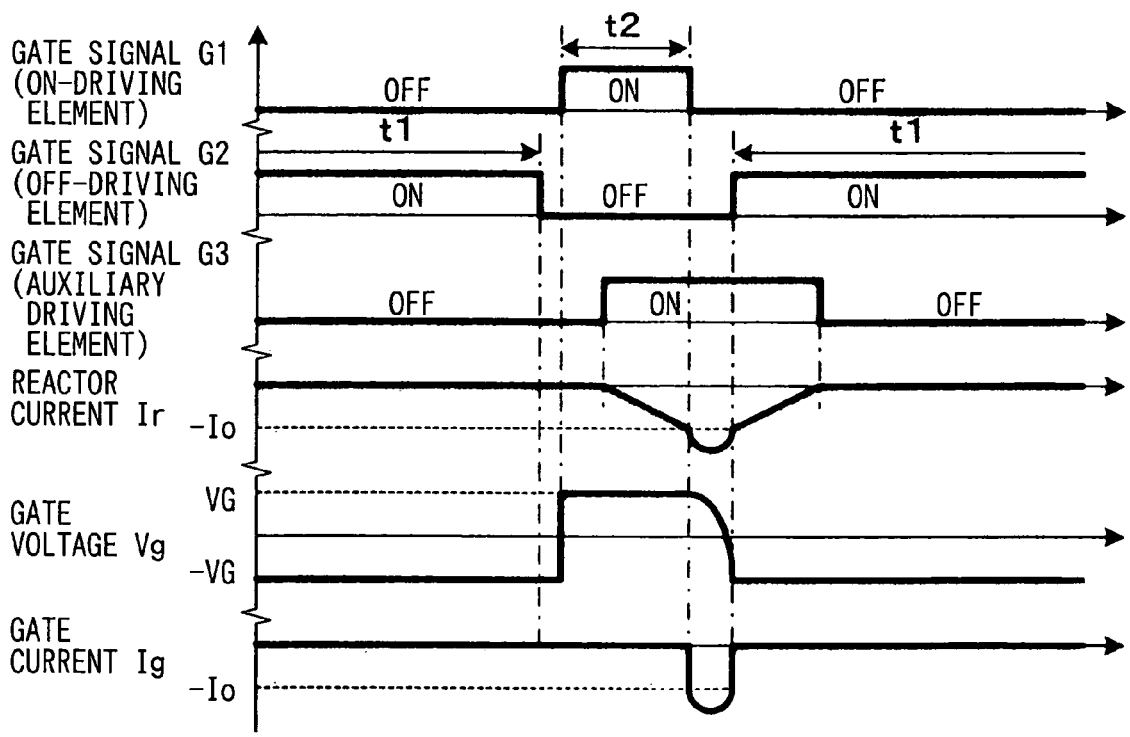

GATE DRIVING CIRCUIT

CROSS REFERENCE TO RELATED APPLICATIONS

This application is based upon, claims the benefit of priority of, and incorporates by reference the contents of, Japanese Patent Application No. 2003-270430 filed on Jul. 2, 2003 and Japanese Patent Application No. 2004-106095 filed on Mar. 31, 2004.

Field of the Invention

The present invention relates to a gate driving circuit for a switching element.

BACKGROUND OF THE INVENTION

A conventional driving circuit for driving a voltage driving type semiconductor switching device such as FET, IGBT or the like includes a switching element (hereinafter referred to as "ON-driving element") for applying an ON-voltage to the gate of a switching element to be driven (hereinafter referred to as "driving target device") and a switching element (hereinafter referred to as "OFF-driving element") for applying an OFF-voltage to the gate of the driving target device.

This type of driving circuit controls an ON/OFF state of the driving target device by turning on one of the ON-driving element and OFF-driving element and turning off the other. The switching operation of the voltage driving type semiconductor switching device can be understood as a charging/discharging process of parasitic capacitance occurring between the gate and emitter (gate and source) and between the gate and collector (gate and drain).

That is, when an ON-voltage is applied to the gate of a driving target device through an ON-driving element or when an OFF-voltage is applied to the gate of the driving target device through an OFF-driving element, the gate voltage or gate current varies at a rate based on a time constant determined by the parasitic capacitance of the gate and a resistance component extending to the gate.

As indicated by a broken line of FIG. 28, the gate current of the driving target device has a peak value just after the switching operation of the driving target device has started, and it is then reduced at the rate based on the time constant. Noise occurring at the switching time is more greatly intensified as then variation rate of current flowing in the driving target device and the variation rate of voltage applied to both the ends of the driving target device (a source/drain voltage, a collector/emitter voltage) are higher. When the resistance component described above is low, the peak value and the variation rate are greatly increased. However, a time required for charging/discharging the parasitic capacitance of the gate is short, and thus there is an advantage of reduced switching loss.

Therefore, the noise is generally suppressed by connecting a resistor to the gate (hereinafter referred to as "gate resistor") to reduce the peak value and variation rate of the gate current. In this case, as indicated by a chain line in FIG. 28, as the resistance of the gate resistor thus connected is increased, the peak value of the gate current is smaller and the time required for charging/discharging the parasitic capacitance of the gate is longer (variation of the gate voltage is moderate), and thus the voltage at both the ends of the driving target device and variation of current are moderate. However, such a driving target device has a drawback of an increased switching loss at the transit time when the ON/OFF state is switched (see FIG. 29).

That is, in the adjustment method using the gate resistor as described above, there is a tradeoff between reduction of noise and reduction of switching loss (high-speed switching). Thus, both of the noise and the switching loss cannot be reduced at the same time.

Furthermore, there is known a gate driving circuit having a gate resistor whose resistance value is adjustable (JP-A-2001-314075 paragraph [0004], FIG. 11, for example). This gate driving circuit is driven as follows. At the switching time of a driving target device (IGBT), the gate resistor is first set to a low resistance value so that the collector-emitter voltage rises up quickly (switched at high speed), and then when the collector-emitter voltage reaches a predetermined value, the gate resistor is switched to a high resistance value to suppress the variation rate of the voltage or current. That is, both the reduction of the switching loss and the reduction of noise are performed at the same time by switching the resistance value of the gate resistor during the switching period.

However, in the gate driving circuit disclosed in JP-A-2001-314075 (hereinafter referred to as "related-art device"), a time period required for turning on or off a voltage driving type semiconductor switching device used as a driving target device is normally set to a short value such as several hundred ns or less, and thus the resistance value must be switched at a good timing within an extremely short switching period in the related-art device. Accordingly, the related-art device must be constructed by elements which operate at high speed to make the gate resistance value variable and also a high-precision sensor for detecting a high voltage, so that the device itself is complicated and high in cost, and also it is difficult to control the device because there is no accessory for control timing.

As described above, the related-art device cannot avoid the tradeoff between the reduction of noise and the reduction of the switching loss because it uses a gate resistor, and thus it cannot be expected to have a great improvement.

Furthermore, the related-art device has a problem in that when the frequency of the switching operation of a driving target element is further increased, a conduction loss at the gate resistor is increased.

SUMMARY OF THE INVENTION

The present invention has been implemented in view of the foregoing problem, and has an object to provide an easily-controllable gate driving circuit which can reduce both of switching loss and noise and also reduce a conduction loss therein.

In order to attain the above object, in a gate driving circuit of the present invention, a driving element unit comprising an ON-driving element and an OFF-driving element is connected to the gate of a driving target device. When a driving controller turns on the ON-driving element, an ON-voltage required to set the driving target device to an ON state is applied to the gate of the driving target device through the ON-driving element. Furthermore, when the driving controller turns on the OFF-driving element, an OFF-voltage required to set the driving target device to an OFF state is applied to the gate of the driving target device through the OFF-driving element. Furthermore, when the driving controller turns off both the ON-driving element and the OFF-driving element, a resonance circuit comprising a reactor constituting an auxiliary driving unit and parasitic capacitance of the gate of the driving target element is formed.

Under the state that the driving target device is turned on, that is, under the state that the ON-driving element is turned on and the OFF-driving element is turned off, current flows from the gate side of the driving target device to the reactor. When the ON-driving element is turned off under the above state, the resonance of the resonance circuit makes the current continue to flow so that accumulated charges in the parasitic capacitance of the gate of the driving target device are discharged and then equal to zero or the parasitic capacitance of the gate of the driving target device is further charged to negative polarity. As a result, the gate voltage drops quickly, and also the voltage applied to both the ends (source-drain voltage, collector-emitter voltage) of the driving target device is quickly increased, and the driving element is turned off. When the gate voltage of the driving target device reaches the OFF-voltage and the driving controller turns on the OFF-driving element, the gate voltage is kept to the OFF-voltage, and the driving target device is kept under an OFF-state.

On the other hand, under the state that the driving target device is turned off, that is, under the state that the ON-driving element is turned off and the OFF-driving element is turned on, current flows from the reactor to the gate side of the driving target device. When the OFF-driving element is turned off under this state, the resonance of the resonance circuit makes current continue to flow so that the accumulated charges of the parasitic capacitance of the gate of the driving target element are discharged and then further charged to negative polarity, or makes current continue to flow so that the parasitic capacitance is charged from the state where the accumulated charge is equal to zero. As a result, the gate voltage rises up quickly, and also the voltage applied to both the ends of the driving target element is quickly reduced, so that the driving target device is turned on. When the gate voltage of the driving target device reaches the ON-voltage and the driving controller turns on the ON-driving element, the gate voltage is kept to the ON-voltage, and thus the driving target device is kept under an ON-state.

Current flowing in the resonance circuit, that is, an initial value of the gate current is equal to current flowing in the reactor when the ON-driving element or OFF-driving element is turned off, and also the gate current and the gate voltage are varied due to a resonance phenomenon of the resonance circuit.

As described above, according to the gate driving circuit of the present invention, the gate current is made to flow by utilizing the resonance phenomenon of the resonance circuit when the driving target device is switched. Therefore, as indicated by a solid line of FIG. 28, the gate current is not sharply varied, and also the gate current larger than the initial value continues to flow, so that the parasitic capacitance of the gate can be rapidly charged/discharged.

Furthermore, the peak value of the gate current can be reduced by setting the initial value of the gate current to a value lower than that of the related-art device.

Therefore, according to the gate driving circuit of the present invention, both reduction of the switching loss (increase of switching speed) of the driving target element and the reduction of the switching noise can be performed at the same time without being restricted by the tradeoff relation unlike the related-art device for controlling the resistance value of the gate resistor.

Furthermore, according to the present invention, the control can be easily performed because it is unnecessary to carry out minute control during the switching period as in the case of the related-art device.

Still furthermore, according to the present invention, the ON-driving element and the OFF-driving element are turned on after the gate voltage is set to the ON-voltage or OFF-voltage, and soft-switching (zero-voltage switching) is carried out. Therefore, the switching loss in the ON-driving element and the OFF-driving element can be greatly reduced.

It is desirable that anti-parallel diodes are connected to or installed in the ON-driving element and the OFF-driving element. In this case, when the gate voltage exceeds the ON-voltage or the OFF-voltage due to the resonance of the resonance circuit (the reactor, the parasitic capacitance of the gate of the driving target device), the voltage applied to both the ends of the ON-driving element (the OFF-driving element) are clamped by each anti-parallel diode. Accordingly, if the ON-driving element and the OFF-driving element are turned on while current flows in the anti-parallel diodes, the zero-voltage switching can be implemented, so that the permissible timing of the switching operation can be broadened and the control can be more easily and surely performed.

The auxiliary driving unit may be designed so that the gate of the driving target device is connected to one end thereof and an intermediate voltage between the ON-voltage and the OFF-voltage is applied to the other end thereof. That is, with respect to the voltage at both the ends of the auxiliary driving unit, when the ON-driving element is turned on, the connection end side of the auxiliary driving unit to the gate of the driving target element is set to high potential, so that current flows through the reactor constituting the auxiliary driving unit so as to flow from the gate side into the reactor. On the other hand, when the OFF-driving element is turned on, the connection end side of the auxiliary driving unit to the gate of the driving target element is set to low potential, so that current flows through the reactor constituting the auxiliary driving unit so as to flow from the reactor into the gate side.

Furthermore, in this case, the auxiliary driving unit may be equipped with an auxiliary driving element serving as a switching element connected to the reactor in series.

That is, with respect to the auxiliary driving unit, it is required that current which is set in magnitude so as to vary the gate voltage to the OFF-voltage or ON-voltage with resonance is made to flow through the reactor until the ON-driving element is turned off when the driving target device is turned off or until the OFF-driving element is turned off when the driving target element is turned on. In other words, it is unnecessary that current larger than the above current is made to flow through the reactor, so that the period for which the current is made to flow through the reactor can be reduced by the auxiliary driving element and thus power consumption at the gate driving circuit can be more greatly reduced.

The auxiliary driving unit may be constructed as follows.

A control end of the reactor (an end portion at the opposite side to the connection side connected to the gate of the driving target device) is connected to a control element unit comprising a first control element serving as a switching element for applying the ON-voltage and a second control element serving as a switching element for applying the OFF-voltage. In a reactor current controller, the first control element is turned on before the OFF-driving element is turned off to turn on the driving target device, that is, under the state that the ON-driving element is turned off/the OFF-driving element is turned on, and the second control element is turned on before the ON-driving element is turned off to turn off the driving target device, that is, under the state that the ON-driving element is turned on/the OFF-driving element is turned off. Accordingly, before the OFF-driving element is turned off, current flows through the first control element, the reactor and the OFF-driving element. On the other hand, before the ON-driving element is turned off, current flows through the ON-driving element, the reactor and the second control element.

Accordingly, the direction of the current flowing through the reactor and the current flowing period can be arbitrarily set by controlling the first and second control elements.

It is preferable that anti-parallel diodes are connected to or installed in the first and second control elements. In this case, at the resonance time after the ON-driving element is turned off, current can continue to flow in the reactor through the anti-parallel diode of the first control element even when both the first and second control elements are turned off. Conversely, at the resonance time after the OFF-driving element is turned off, current can continue to flow in the reactor through the anti-parallel diode of the second control element even when the first and second control elements are turned off. That is, the control of the first and second control elements can be simplified by the current controller.

BRIEF DESCRIPTION OF THE DRAWINGS

The above and other objects, features and advantages of the present invention will become more apparent from the following detailed description made with reference to the accompanying drawings. In the drawings:

FIGS. 5A and 5B are timing charts showing a control method when an ON period of a driving target device is short;

DETAILED DESCRIPTION OF THE PREFERRED EMBODIMENTS

Preferred embodiments according to the present invention will be described hereunder with reference to the accompanying drawings.

First Embodiment

Figure 1:
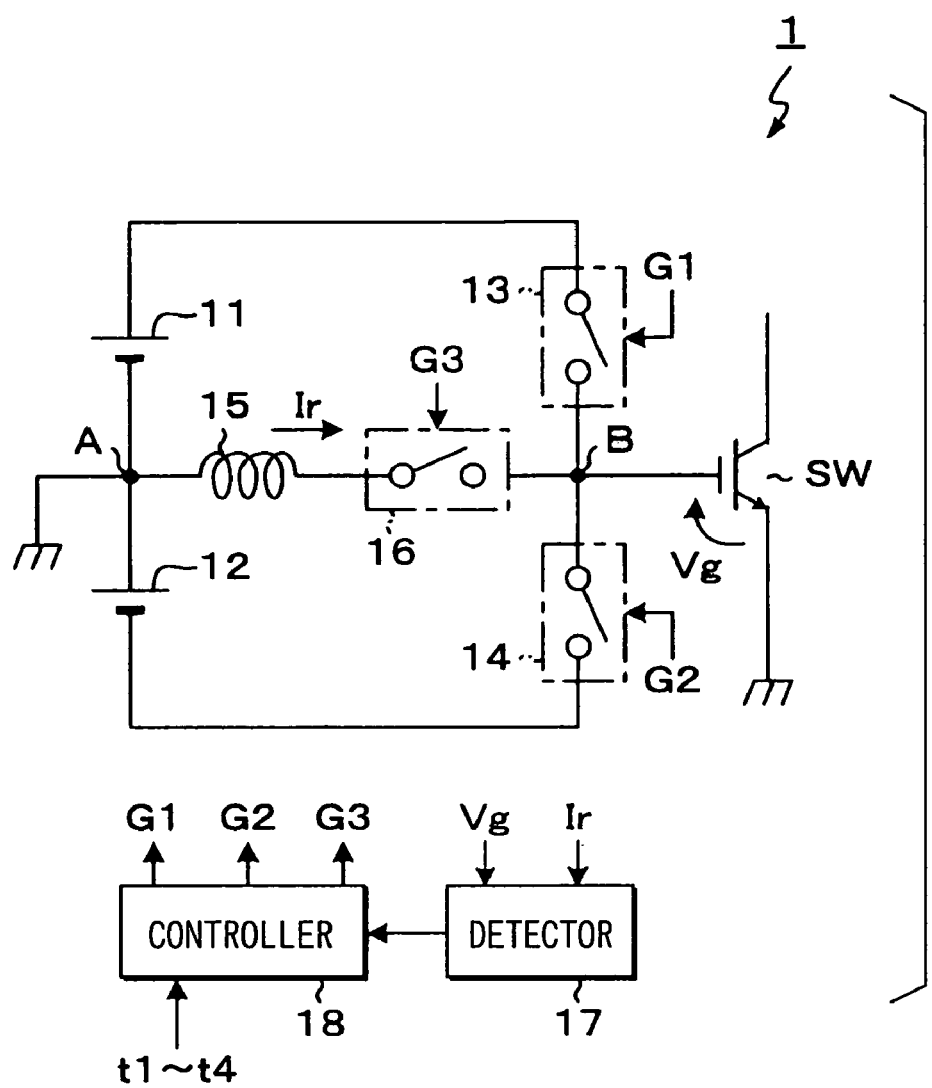
FIG. 1 is a circuit diagram showing the construction of a gate driving circuit according to a first embodiment.

FIG. 1 is a circuit diagram showing the construction of a gate driving circuit according to a first embodiment for carrying out an ON/OFF driving operation of a driving target device which corresponds to a voltage driving type switching device. In this embodiment, IGBT (insulated gate bipolar transistor) is used as a driving target device SW. The reference potential of a gate voltage is set to emitter potential.

As shown in FIG. 1, a gate driving circuit 1 of this embodiment is equipped with a pair of DC power sources 11, 12 which are connected to each other in series, and the connection point between the DC power supply sources (hereinafter referred to as "power source intermediate point") A is set as a reference potential.

The gate driving circuit 1 is further equipped with a driving element unit comprising a switching element (hereinafter referred to as "ON-driving element") 13 through which a power supply passage for supplying a positive voltage VG (hereinafter referred to as "ON-voltage") from the DC power source 11 is connected to or disconnected from the gate of the driving target device SW in accordance with a gate signal G1, and a switching element (hereinafter referred to as "OFF-driving element") 14 through which a power supply passage for supplying a negative voltage (hereinafter referred to as "OFF-voltage") –VG from the DC power source 12 is connected to or disconnected from the gate of the driving target device SW in accordance with a gate signal G2.

The voltage |VG| is set to not less than the absolute value of the gate-emitter voltage required to surely turn on or off the driving target device SW. In this case, the ON-voltage and the OFF-voltage are set to have the same absolute value, however, both the absolute values thereof may be different from each other (the same is satisfied in other embodiments).

Furthermore, the gate driving circuit 1 is equipped with an auxiliary driving unit comprising a reactor 15 and a switching element (hereinafter referred to as "auxiliary driving element") 16 driven with a gate signal G3, the reactor 15 and the switching element 16 being connected to each other in series, and one end of the auxiliary driving unit is connected to the power source intermediate point A while the other end thereof is connected to the connection point (hereinafter referred to as "output point") B between the ON-driving element 13 and the OFF-driving element 14, that is, the gate of the driving target device SW.

Furthermore, the gate driving circuit 1 is further equipped with a driving controller comprising a detector 17 for detecting the potential of the output point B with respect to the reference potential, that is, the gate-emitter voltage (hereinafter referred to as "gate voltage") Vg of the driving target device SW and current (hereinafter referred to as "reactor current") Ir flowing in the reactor 15, and a controller 18 for generating gate signals G1 to G3 in accordance with a detection result of the detector 17 and controlling the driving of the driving target device SW.

The detection of the detector 17 may be carried out by a well-known method. With respect to the gate voltage Vg, for example, it may be detected by measuring a divisional voltage which is divided by a voltage dividing circuit comprising a serial resistor connected between the gate and emitter of the driving target device SW. With respect to the reactor current Ir, it may be detected by measuring magnetic field occurring from the reactor 15 when the reactor current Ir flows, or by inserting a shunt resistor in the circuit in advance and measuring voltage drop through the shunt resistor.

Subsequently, the controller 18 is mainly constructed by a well-known microcomputer comprising CPU, ROM and RAM, and executes the switching control processing of generating gate signals G1 to G3 to switch the ON-driving element 13, the OFF-driving element 14 and the auxiliary driving element 16 on the basis of set times t1 to t4 indicated from the external and the detection result of the detector 17, and other processing.

The set time t1 corresponds to an OFF-period of the driving target device SW, and the set time t2 corresponds to an ON-period of the driving target device SW. The set time t3 is a time required to vary the reactor current Ir from 0 to a predetermined value Io, and the set time t4 is a time required to vary the reactor current Ir from a predetermined value 0 to –Io. In this case, the predetermined value used to set the set time t3 and the predetermined value used to set the set time t4 are set to be equal to each other in absolute value, however, the absolute values thereof may be different (the same is satisfied in other embodiments).

Figure 2:
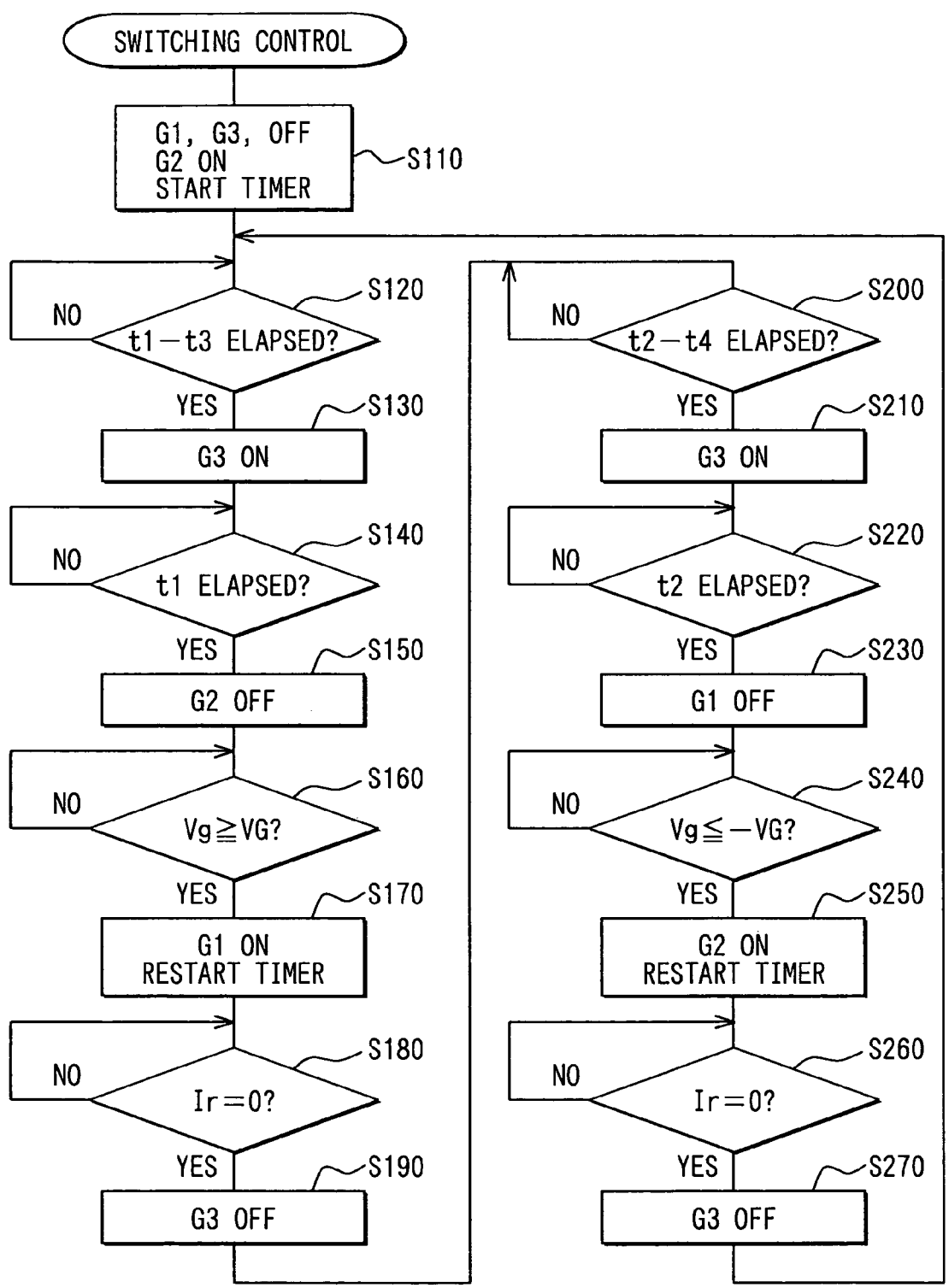
FIG. 2 is a flowchart showing the content of switching control processing executed by a controller in the first embodiment.
Figure 3:
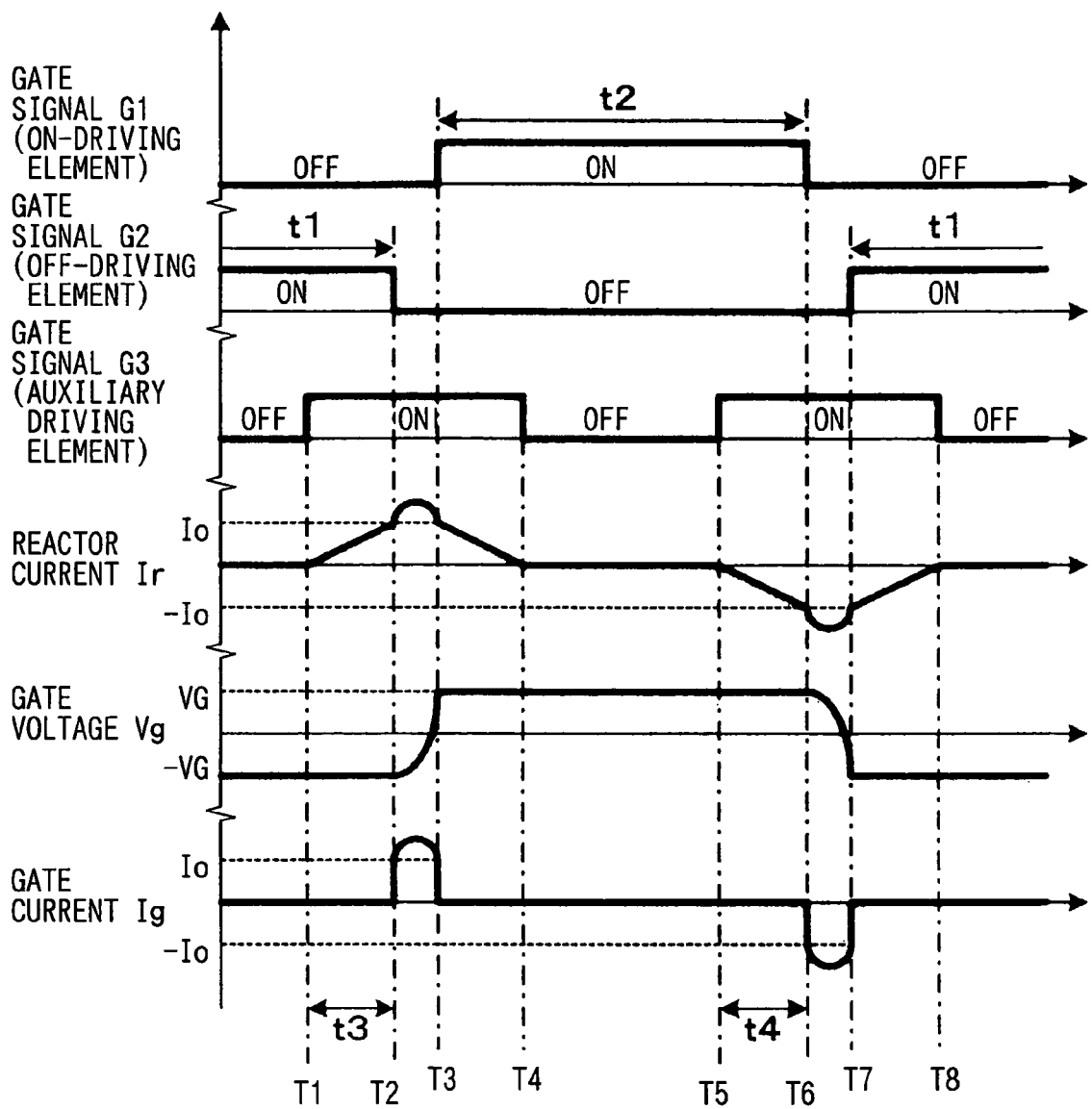
FIG. 3 is a timing chart of gate signals generated by the controller and voltage and current waveforms of respective parts of a gate driving circuit in the first embodiment.

Here, the switching control processing will be described with reference to the flowchart of FIG. 2, the timing chart of FIG. 3 and the diagram of FIG. 4.

When this processing is started, the gate signals G1, G3 are initialized to OFF while the gate signal G2 is initialized to ON, and a timer is started to count the switching timing of the gate signals G1 to G3 (S110).

Figure 4A:
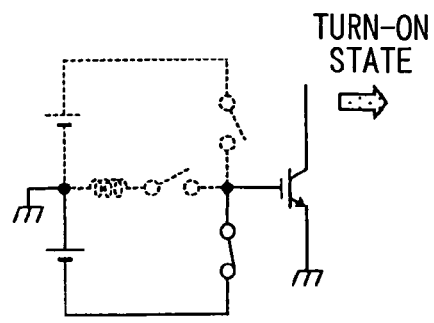
FIGS. 4A–4E are diagrams showing the operation of the gate driving circuit according to the first embodiment.

At this time, as shown in FIG. 4A, the ON-driving element 13 and the auxiliary driving element 16 are set to an OFF-state, and the OFF-driving element 14 is set to ON-state, so that the gate of the driving target device SW is kept to a state where the OFF-voltage –VG from the DC power source 12 is applied through the OFF-driving element 14 to the gate of the driving target device SW.

The processing is on standby until the time t1–t3 calculated from the set times t1, t3 has elapsed while monitoring the timer (S120). When the time t1–t3 has elapsed (timing T1), the gate signal G3 is set to ON, so that the auxiliary driving element 16 is turned on (S130).

Figure 4B:
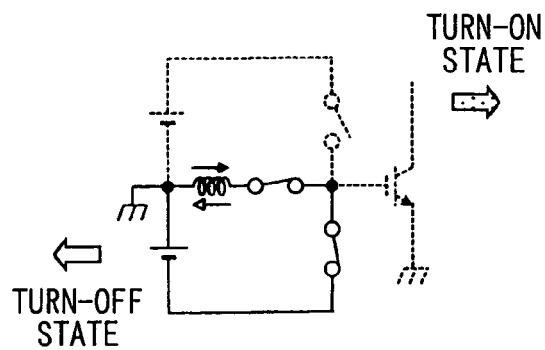

At this time, as shown in FIG. 4B, a closed circuit comprising the DC power source 12, the reactor 15, the auxiliary driving element 16 and the OFF-driving element 14 is formed, and the reactor current Ir directing from the power source intermediate point A to the output point B flows into the reactor 15. The absolute value |Ir| of the reactor current increases linearly with time lapse.

Thereafter, it is judged by monitoring the timer whether the set time t1 has elapsed from the time when the gate signal G2 is set to ON (S140), and if the set time t1 has not elapsed, the processing is kept on standby.

Figure 4C:
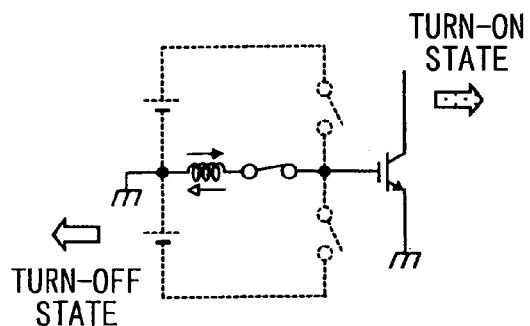

When the set time t1 has elapsed (timing T2), the OFF-driving element 14 is turned off by setting the gate signal G2 to OFF (S150). At this time, a closed circuit (resonance circuit) comprising the reactor 15, the auxiliary driving element 16 and the parasitic capacitance of the gate of the driving target device SW (hereinafter referred to as "gate capacitance") is formed as shown in FIG. 4C. By the resonance phenomenon of the resonance circuit, gate current (reactor current Ir) larger than the reactor current Io (initial value) flowing when the OFF-driving element 14 is turned off flows in the closed circuit, whereby charging/discharging to/from the gate capacitance is quickly carried out and thus the gate voltage Vg is rapidly increased.

The processing is on standby until the gate voltage Vg detected by the detector 17 reaches the ON-voltage VG (S160). When the gate voltage Vg reaches the ON-voltage VG (timing T3), the ON-driving element 13 is turned on by setting the gate signal G1 to ON, and also the timer is restarted (S170).

When the ON-driving element 13 is turned on as described above, a closed circuit comprising the DC power source 11, the ON-driving element 13, the auxiliary driving element 16 and the reactor 15 is formed as shown in FIG.

4D, so that the reactor Ir flows back to the DC power source 11. At this time, the absolute value |Ir| of the reactor current is reduced linearly with time lapse.

Therefore, the processing is on standby until the reactor current Ir detected by the detector 17 is equal to zero (S180). When the reactor current Ir is equal to zero (timing T4), the auxiliary driving element 16 is turned off by setting the gate signal G3 to OFF (S390). That is, the auxiliary driving element 16 is soft-switched (in this case, it is subjected to zero-current switching).

Figure 4D:
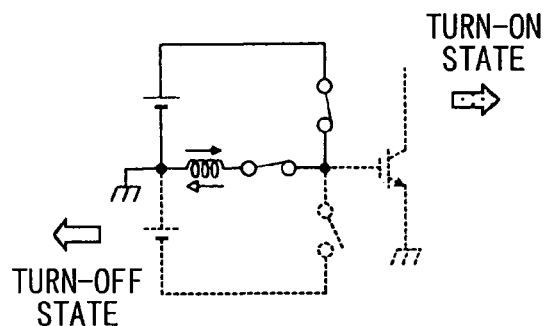
Figure 4E:
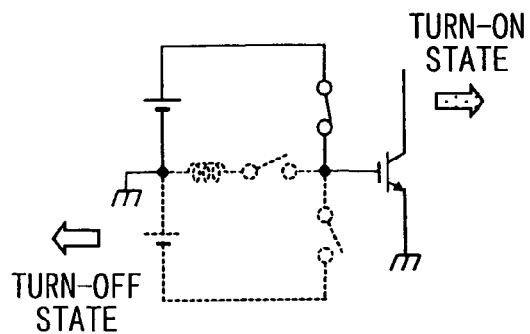

At this time, as shown in FIG. 4E, the gate of the driving target device SW is kept to a state where the ON-voltage VG is applied from the DC power source 11 through the ON-driving element 13 to the gate of the driving target device SW.

Subsequently, in S200 to S270, the same processing as S120 to S190 is executed by making a replacement like t1→t2, t3→t4, G1→G2, G2→G1.

That is, the processing is on standby until the time t2–t4 calculated from the set times t2, t4 has elapsed while monitoring the timer (S200). When the time t2–t4 has elapsed (timing T5), the auxiliary driving element 16 is turned on by setting the gate signal G3 to ON (S210).

At this time, a closed circuit comprising the DC power source 11, the ON-driving element 13, the auxiliary driving element 16 and the reactor 15 is formed as shown in FIG. 4D, and the reactor current Ir directing from the output point B to the power source intermediate point A flows in the reactor 15, and the absolute value |Ir| of the reactor current increases linearly with time lapse.

Thereafter, it is judged by monitoring the time whether the set time t2 has elapsed from the time when the gate signal G1 is set to ON (S220), and if the set time t2 has not yet elapsed, the processing is kept on standby.

When the set time t2 has elapsed (timing T6), the ON-driving element 13 is turned off by setting the gate signal G1 to OFF (S230). At this time, as shown in FIG. 4C, a closed circuit (resonance circuit) comprising the gate capacitance, the auxiliary driving element 16 and the reactor 15 is formed. The reactor current –Io flowing when the ON-driving element 13 is turned off is set as an initial value, and the gate current (reactor current Ir) whose absolute value is larger than the initial value flows by the resonance phenomenon of the resonance circuit, so that discharging/charging to the gate capacitance with the opposite polarity to that in the case of S150 is quickly carried out and thus the gate voltage Vg is rapidly reduced.

The processing is on standby until the gate voltage Vg detected by the detector 17 reaches the OFF-voltage –VG (S240). When the gate voltage Vg reaches the OFF-voltage –VG (timing T7), the OFF-driving element 14 is turned on by setting the gate signal G2 to ON, and also the timer is restarted (S250).

When the OFF-driving element 14 is turned on as described above, a closed circuit comprising the DC power source 12, the reactor 15, the auxiliary driving element 16 and the OFF-driving element 14 is formed as shown in FIG. 4B, and the reactor current Ir flows back to the DC power source 12. At this time, the absolute value |Ir| of the reactor current decreases linearly with time lapse.

Therefore, the processing is on standby until the reactor current Ir detected by the detector 17 is equal to zero (S260). When the reactor current Ir is equal to zero (timing T8), the auxiliary driving element 16 is turned off by setting the gate signal G3 to OFF (S270), and then the processing returns to S120. That is, the auxiliary driving element 16 is soft-switched (i.e., is subjected to zero-current switching).

At this time, as shown in FIG. 4A, the gate of the driving target device SW is kept to a state where the OFF-voltage –VG from the DC power source 12 is applied thereto through the OFF-driving element 14, that is, the processing returns to the same state achieved when S110 is executed.

As described above, according to the gate driving circuit 1 of this embodiment, when the driving target device SW is turned on, the reactor current Ir is made to flow from the power source intermediate point A to the output point B in advance, the resonance circuit formed of the reactor 15 and the gate capacitance is resonated just before the driving target device SW is turned on, so that the gate capacitance is charged/discharged to make the gate current (reactor current Ir) flow so as to increase Vg.

When the driving target device SW is turned off, the reactor current Ir is made to flow from the output point B to the power source intermediate point A in advance, and the resonance circuit formed of the reactor 15 and the gate capacitance is resonated just before the driving target device SW is turned off so that the gate capacitance is charged/discharged (charged/discharged with the opposite polarity to that when the driving target device SW is turned on) to make the gate current (reactor current Ir) flow so as to reduce Vg.

As described above, according to the gate driving circuit 1 of this embodiment, the gate current is made to flow by using the resonance phenomenon of the resonance circuit at the switching time of the driving target device SW. Therefore, as indicated by a solid line of FIG. 2B, the gate current does not vary rapidly and also the gate current larger than the initial value |Io| continues to flow, so that the gate capacitance is quickly charged/discharged.

Furthermore, the peak value of the gate current can be reduced by setting the initial value |Io| of the gate current to a smaller value than the related-art device.

Accordingly, according to the gate driving circuit 1 of this embodiment, both reduction of the switching loss (increase of switching speed) of the driving target device SW and reduction of the switching noise can be performed at the same time without being restricted by the tradeoff relation unlike the related-art device for controlling the resistance value of the gate resistor.

Furthermore, in the gate driving circuit 1 of this embodiment, the ON-driving element 13 and the OFF-driving element 14 are subjected to zero-voltage switching, and the auxiliary driving element 16 is subjected to zero-current switching, so that switching loss and noise occurring in each driving element of the gate driving circuit 1 can be also greatly reduced.

In this embodiment, the gate current is made to flow by utilizing the resonance phenomenon of the resonance circuit in both of the case where the driving target device SW is turned on and the case where it is turned off. However, when at least one of the set times t1, t2 is shorter than the time required to vary the reactor current from Io to –Io, the gate current may be made to flow by applying the above method in only one of the above turn-on and turn-off cases of the driving target device SW.

Figure 6A:
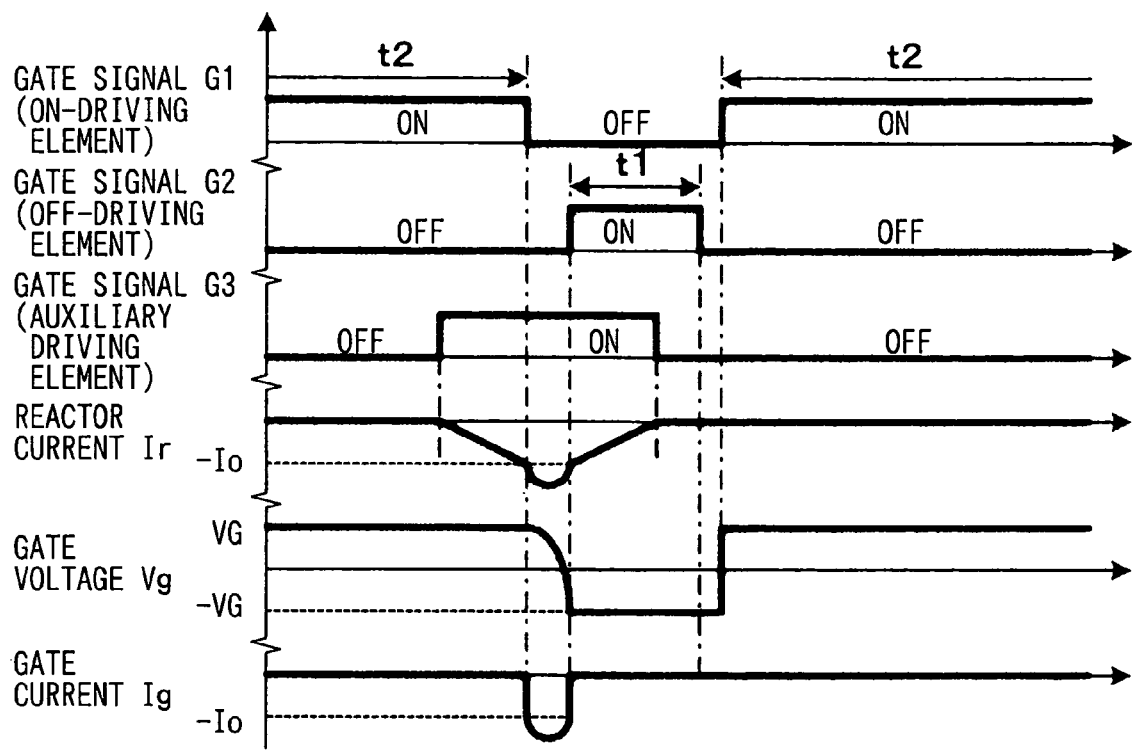
FIGS. 6A and 6B are timing charts showing a control method when an OFF period of the driving target device is short.
Figure 6B:
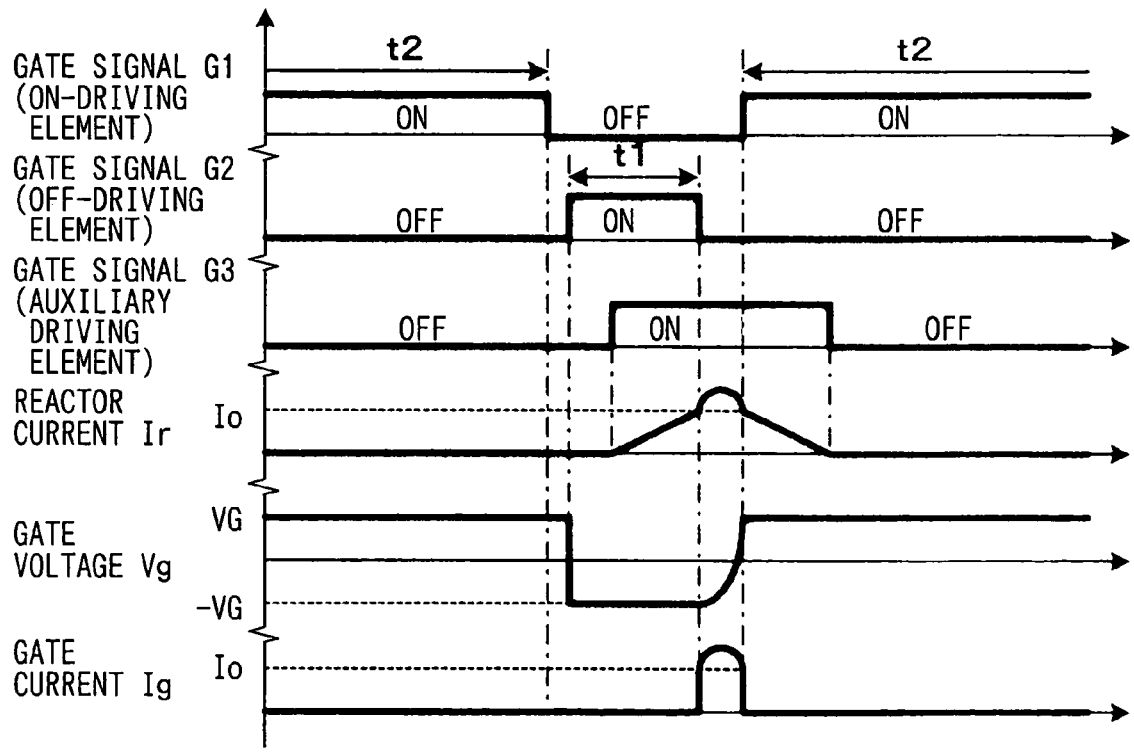

Here, FIG. 5A is a timing chart in the case of the application of the above method to only the case where the driving target device SW is turned on when the set time t2 (on-period of the driving target device SW) is short, and FIG. 5B is a timing chart in the case of the application of the above method to only the case where the driving target device SW is turned off. Furthermore, FIG. 6A is a timing chart in the case of the application of the above method to only the case where the driving target device SW is turned off when the set time t1 (off-period of the driving target device SW) is short, and FIG. 6B is a timing chart in the case of the application of the above method to only the case where the driving target device SW is turned on.

Second Embodiment

Next, a second embodiment according to the present invention will be described.

A gate driving circuit 1a of this embodiment is different from the gate driving circuit 1 of the first embodiment merely in a part of the construction, and the same constituent elements between the first and second embodiments are represented by the same reference numerals. Therefore, the descriptions on the same constituent elements are omitted, and only the difference in construction will be mainly described.

Figure 7A:
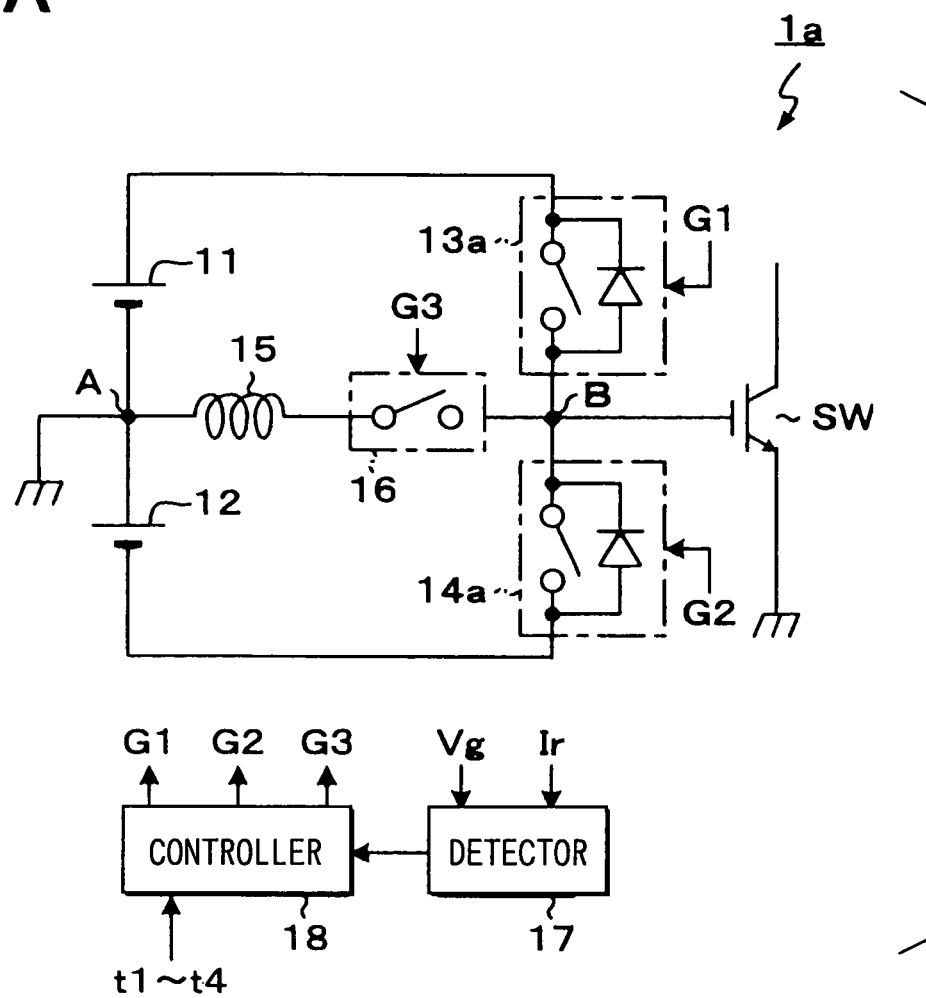
FIGS. 7A to 7C are circuit diagrams showing the construction of a gate driving circuit according to a second embodiment.

As shown in FIG. 7A, the gate driving circuit 1a of this embodiment uses anti-parallel diodes connected to or installed in the gate driving circuit 1a as an ON-driving element 13a and an OFF-driving element 14a. In the gate driving circuit 1a of this embodiment thus constructed, the same operation of the gate driving circuit 1 of the first embodiment is carried out except for the following case.

Figure 7B:
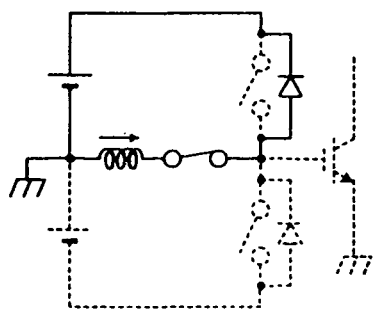
Figure 7C:
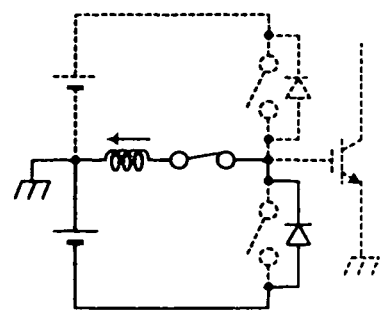

That is, if the gate voltage Vg exceeds the ON-voltage Vg during the period from the formation time of a resonance circuit (see FIG. 4C) until the turn-on time of the gate signal G1 (see FIG. 4D) when the driving target device SW is turned on, the anti-parallel diode of the ON-driving element 13a is conducted as shown in FIG. 7B and thus the reactor current Ir flows back to the DC power source 11. On the other hand, if the gate voltage Vg decreases below the OFF-voltage –VG during the period from the formation time of a resonance circuit (see FIG. 4C) until the time of setting the gate signal G2 to ON (see FIG. 4B) when the driving target device SW is turned off, the anti-parallel diode of the OFF-driving element 14a is conducted as shown in FIG. 7C, and thus the reactor current Ir flows back to the DC power source 12.

Figure 8:
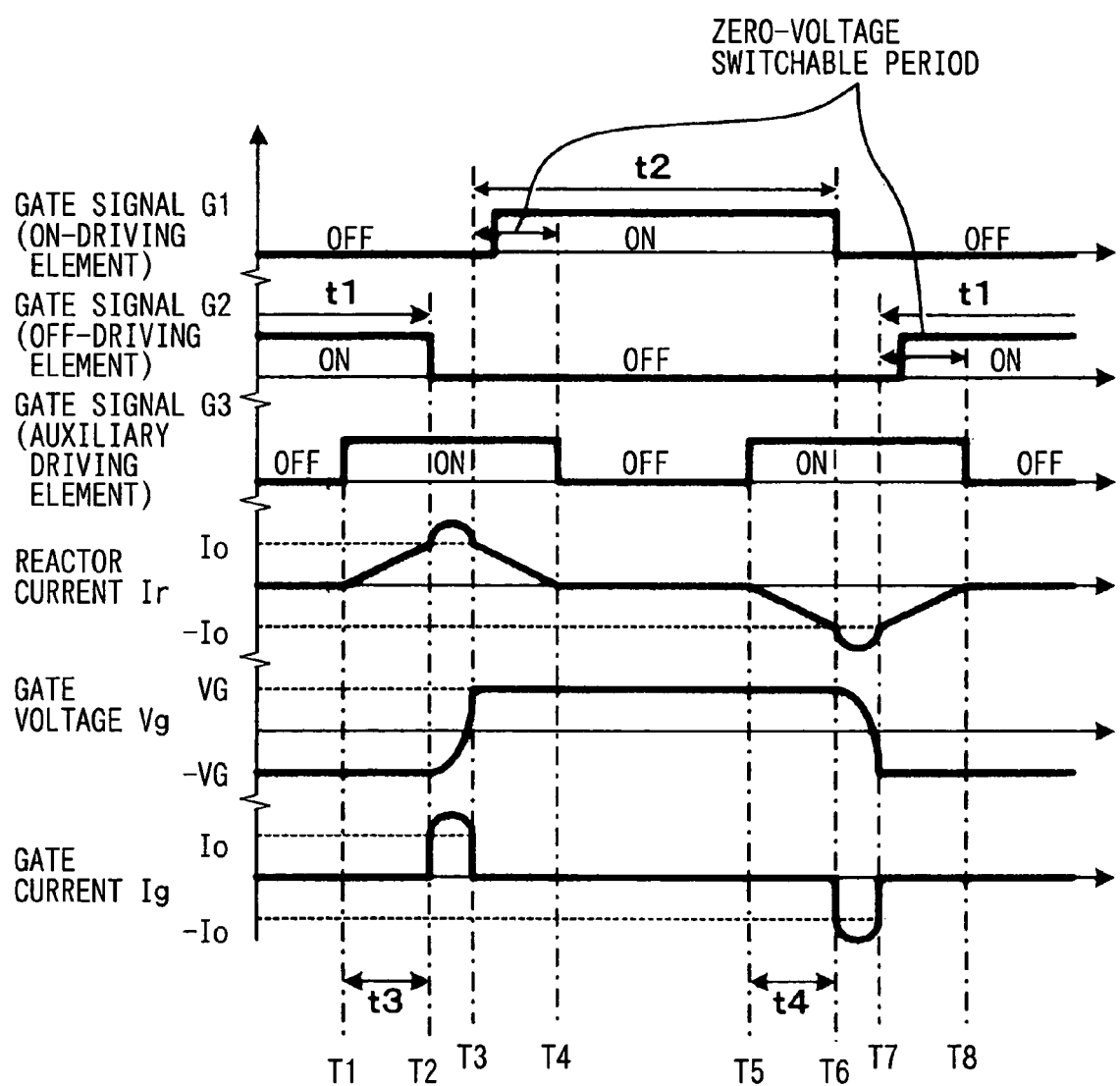
FIG. 8 is a timing chart showing gate signals generated by a controller and voltage and current waveforms of respective parts of the gate driving circuit in the second embodiment.

Accordingly, according to the gate driving circuit 1a of this embodiment, not only the same effect as the gate driving circuit of the first embodiment is achieved, but also the switching control of the ON-driving element 13a and the OFF-driving element 14a can be easily and surely performed because zero-voltage switching can be carried out within the period (the period of Ir≠0 after the timing T3, T7) when current flows in the anti-parallel diodes as shown in FIG. 8 at the turn-on time of the ON-driving element 13a and the OFF-driving element 14a.

Third Embodiment

Next, a third embodiment according to the present invention will be described.

A gate driving circuit 1b of this embodiment is different from the gate driving circuit 1 of the first embodiment merely in a part of the construction, and the same constituent elements between the first and third embodiments are represented by the same reference numerals. Therefore, the descriptions on the same constituent elements are omitted, and only the difference in construction will be mainly described.

Figure 9:
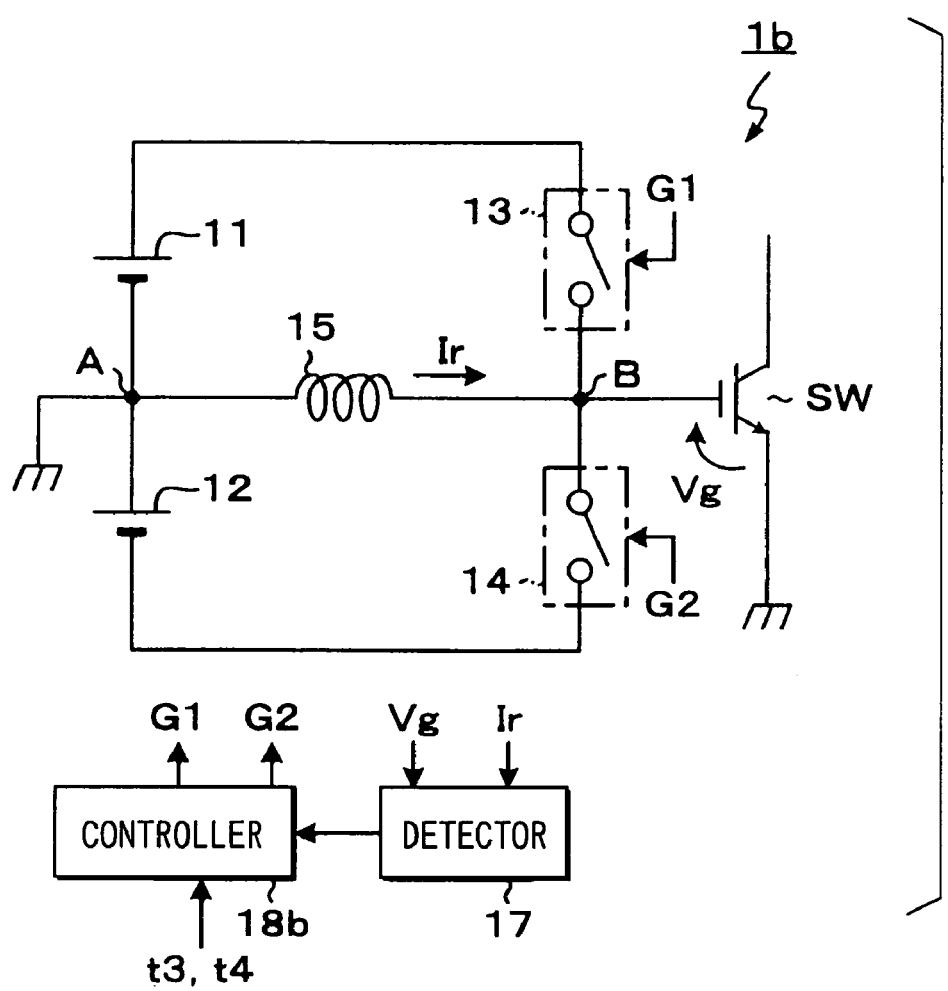
FIG. 9 is a circuit diagram showing the construction of a gate driving circuit according to a third embodiment.

As shown in FIG. 9, the gate driving circuit 1b of this embodiment has a construction achieved by deleting the auxiliary driving element 16 from the gate driving circuit 1 of the first embodiment, and a controller 18b is designed to execute the switching control processing to generate the gate signals G1, G2 to switch the ON-driving element 13 and the OFF-driving element 14 on the basis of the detection result of the detector 17 and the set times t3, t4.

The set time t3 is a time required to vary the reactor current Ir from 0 to a predetermined value Io, and the set time t4 is a time required to vary the reactor current Ir from a predetermined value 0 to –Io.

Figure 10:
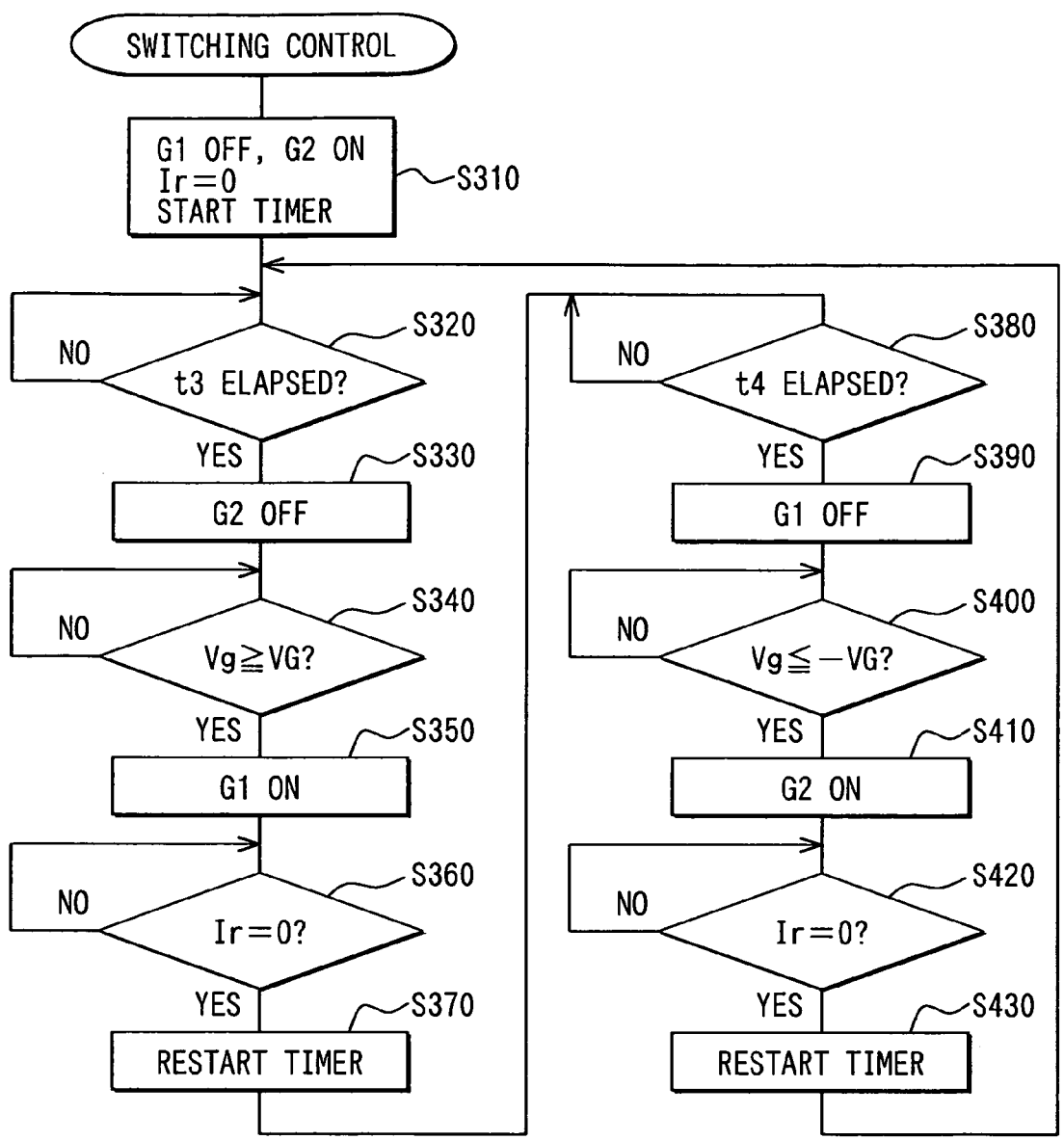
FIG. 10 is a flowchart showing the content of switching control processing executed by a controller in the third embodiment.
Figure 11:
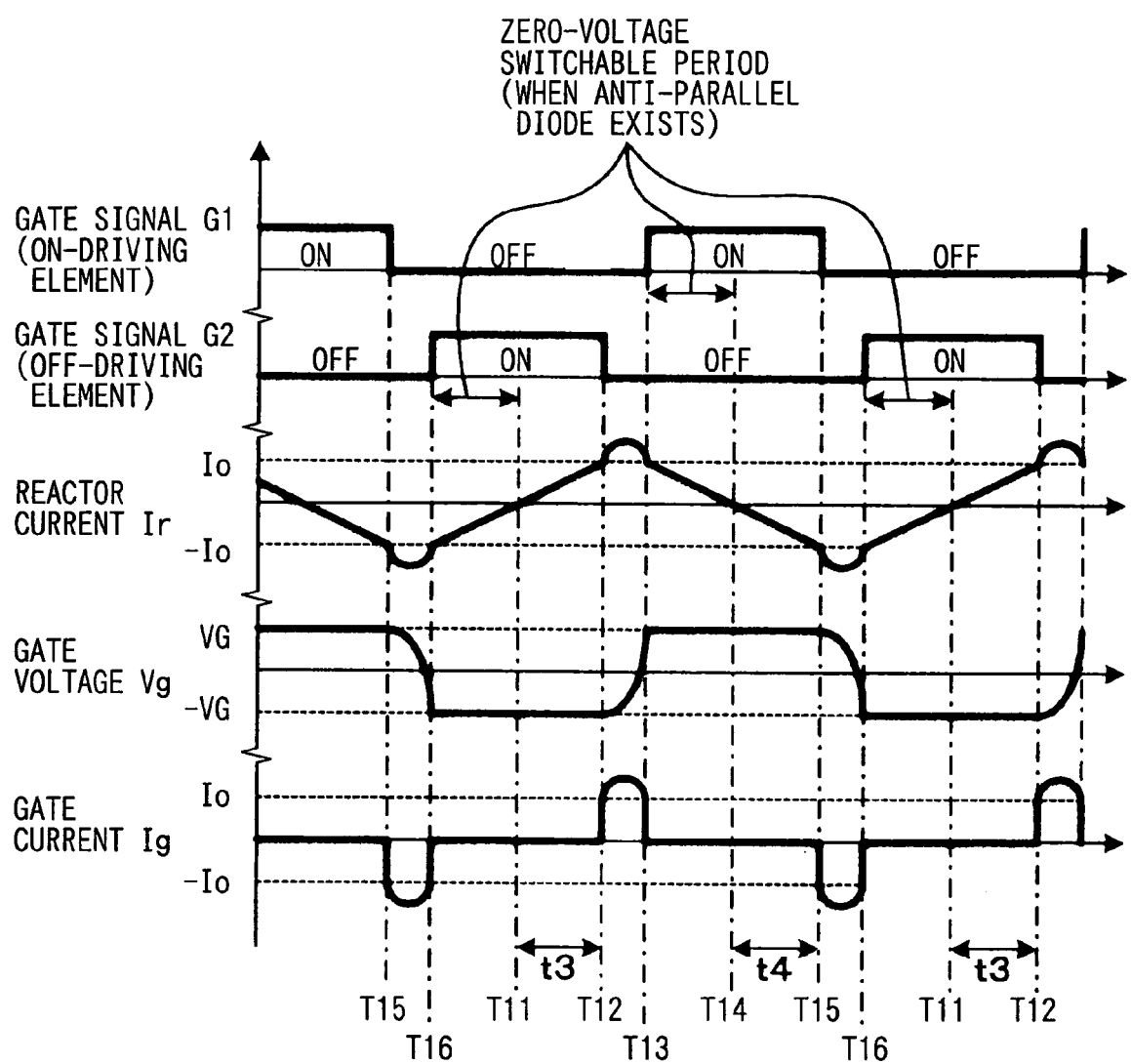
FIG. 11 is a timing chart showing gate signals generated by the controller and voltage and current waveforms of respective parts of the gate driving circuit in the third embodiment.

Here, the switching control processing will be described with reference to a flowchart of FIG. 10, a timing chart of FIG. 11 and the diagrams of FIGS. 12A–12C.

When this processing is started, first, the gate signal G1 is set to OFF, the gate signal G2 is set to ON, Ir is initialized to zero (see timing T11 of FIG. 11), and a timer for counting the switching timing of the gate signals G1, G2 is started (S310).

Figure 12A:
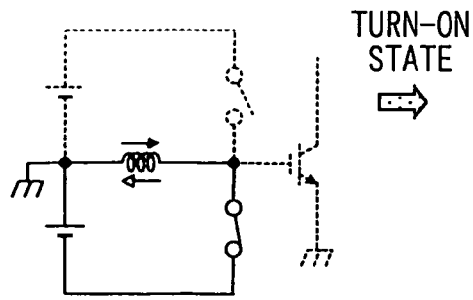
FIGS. 12A–12C are diagrams showing the operation of the gate driving circuit of the third embodiment.
Figure 12B:
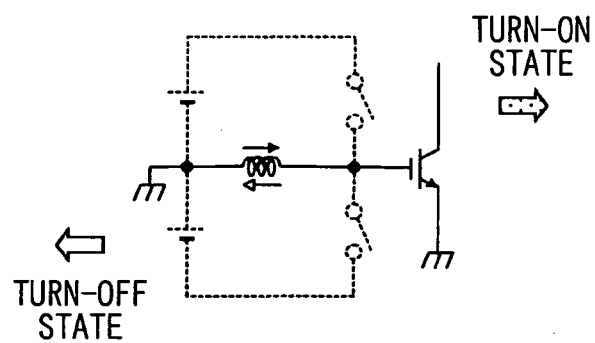

At this time, the ON-driving element 13 is turned off and the OFF-driving element 14 is turned on as shown in FIG. 12A, so that the OFF-voltage –VG is applied form the DC power source 12 through the OFF-driving element 14 to the gate of the driving target device SW. In addition, a closed circuit comprising the DC power source 12, the reactor 15 and the OFF-driving element 14 is formed, so that the reactor current Ir flows in the reactor 15 in the direction from the power source intermediate point A to the output point B, and the absolute value |Ir| thereof increases linearly with time lapse.

Thereafter, it is judged by monitoring the timer whether the set time t3 has elapsed from the time when the counting of the timer is started (S320). If the set time t3 has not yet elapsed, the processing is kept on standby.

When the set time t3 has elapsed (timing T12), the OFF-driving element 14 is turned off by setting the gate signal G2 to OFF (S330). At this time, a closed circuit (resonance circuit) comprising the reactor 15 and the gate capacitance of the driving target device SW is formed as shown in FIG. 12B. By the resonance phenomenon of the resonance circuit, gate current (reactor current Ir) larger than the initial value corresponding to the reactor current Io flowing at the turn-off time of the OFF-driving element 14 flows, so that charging/discharging to/from the gate capacitance is quickly carried out and thus the gate voltage Vg is rapidly increased.

The processing is on standby until the gate voltage Vg detected by the detector 17 reaches the ON-voltage VG (S340). When the gate voltage Vg reaches the ON-voltage VG (timing T13), the ON-driving element 13 is turned on by setting the gate signal G1 to ON (S350).

Figure 12C:
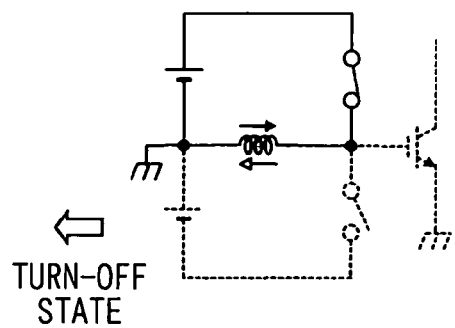

At this time, the ON-voltage VG from the DC power source 11 is applied to the gate of the driving target device SW through the ON-driving element 13 as shown in FIG. 12C. In addition, a closed circuit comprising the DC power source 11, the ON-driving element 13 and the reactor 15 is formed, and thus the reactor current Ir flows back to the DC power source 11. At this time, the absolute value |Ir| of the reactor current decreases linearly with time lapse.

Therefore, the processing is on standby until the reactor current Ir detected by the detector 17 is equal to zero (S360), and when the reactor current Ir is equal to zero (timing T14), the timer is restarted (S370).

At this time, the reactor current Ir flows in the reactor 15 in the direction from the output point B to the power source intermediate point A by the closed circuit formed of the DC power source 11, the ON-driving element 13 and the reactor 15 as shown in FIG. 12C, and the absolute value |Ir| thereof increases linearly with time lapse.

In S380 to S430, the same processing of S320 to S370 is executed by making a replacement like t3→t4, G1→G2, G2→G1. That is, it is judged by monitoring the timer whether the set time t4 has elapsed from the time when the counting of the timer is started (S380). If the set time t4 has not yet elapsed, the processing is kept on standby.

When the set time t4 has elapsed (timing T15), the ON-driving element 13 is turned off by setting the gate signal G1 to OFF (S390). At this time, a closed circuit (resonance circuit) comprising the gate capacitance and the reactor 15 is formed as shown in FIG. 12B. The gate current (reactor current Ir) whose absolute value is larger than the initial value corresponding to the reactor current −Io flowing when the ON-driving element 13 is turned off is made to flow by the resonance phenomenon of the resonance circuit. Accordingly, charging/discharging to/from the gate capacitance is quickly carried out with the opposite polarity to that in the case of S330, and thus the gate voltage Vg is rapidly reduced.

Then, the processing is on standby until the gate voltage Vg detected by the detector 17 reaches the OFF-voltage −VG (S400). If the gate voltage Vg reaches the OFF-voltage −VG (timing T16), the OFF-driving element 14 is turned on by setting the gate signal G2 to ON (S410).

At this time, as shown in FIG. 12A, the OFF-voltage −VG from the DC power source 12 is applied to the gate of the driving target device SW through the OFF-driving element 14. In addition, a closed circuit comprising the DC power source 12, the reactor 15 and the OFF-driving element 14 is formed, and thus the reactor current Ir flows back to the DC power source 12. At this time, the absolute value |Ir| of the reactor current decreases linearly with time lapse.

Therefore, the processing is on standby until the reactor current Ir detected by the detector 17 is equal to zero (S420), and if the reactor Ir is equal to zero (timing T11), the timer is restarted (S430) and then the processing returns to S320.

At this time, the reactor current Ir flows in the reactor 15 in the direction from the power source intermediate point A to the output point B by the closed circuit comprising the DC power source 12, the OFF-driving element 14 and the reactor 15 as shown in FIG. 12A, and the absolute value |Ir| thereof increases linearly with time lapse. That is, the state is returned to the same state when S310 is executed.

In the gate driving circuit 1b of this embodiment thus constructed, the operation thereof can be performed even when the duty of the driving target device SW is variable. Furthermore, when the gate driving circuit 1b is operated at a duty of 50% and also the on-period and the off-period are fixed, the gate driving circuit 1b can be properly used. The same effect as the gate driving circuit 1 of the first embodiment can be achieved except for the setting of the on-period and the off-period.

In this embodiment, the ON-driving element 13 and the OFF-driving element 14 may be modified so that antiparallel diodes are connected to or installed in these elements 13 and 14. In this case, as in the case of the second embodiment, the zero-voltage switching can be performed within the period (the period of Ir≠0 after the timing T13, T16, see FIG. 11) for which current flows in the anti-parallel diodes when the ON-driving element and the OFF-driving element are turned on, and thus the switching control of these elements can be easily and surely performed.

Fourth Embodiment

Next, a fourth embodiment of the present invention will be described.

In the gate driving circuits of the first to third embodiments, IGBT which is driven with the driving signal (gate voltage Vg) having both the polarities is used as the driving target device SW. However, in this embodiment, a MOSFET which is driven with a driving signal (gate voltage Vg) having a single polarity is used as the driving target device SW. That is, in this embodiment, the OFF-voltage is set to the source potential of the driving target device SW.

Figure 13A:
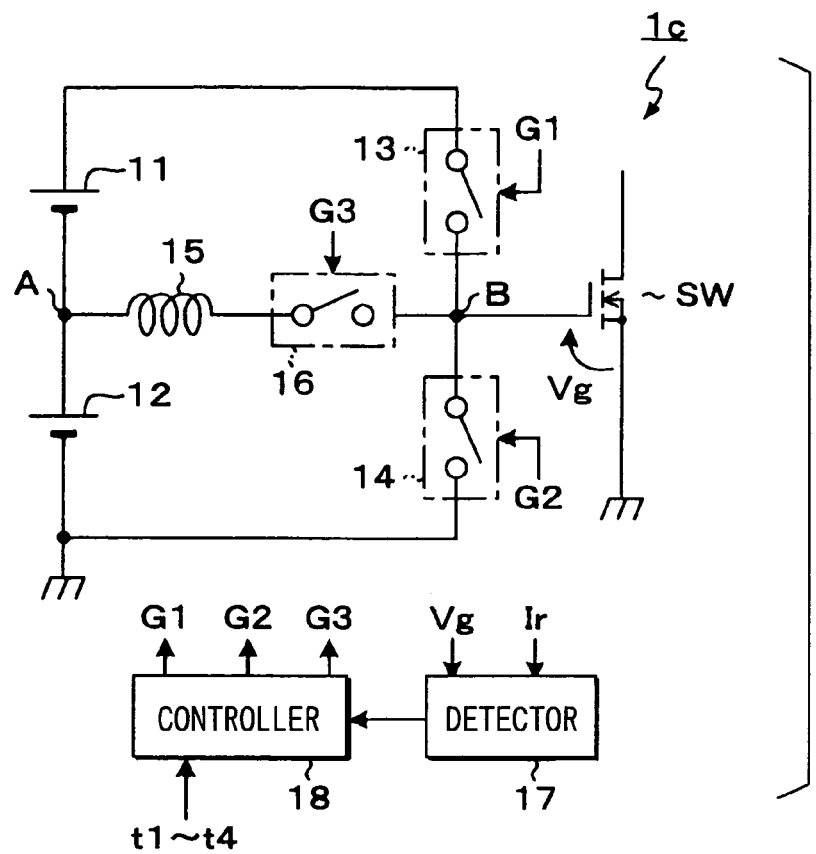
FIGS. 13A and 13B are circuit diagrams showing the constructions of gate driving circuits according to fourth and fifth embodiments respectively.

As shown in FIG. 13A, the gate driving circuit 1c of this embodiment is designed to have the same construction as the gate driving circuit 1 of the first embodiment except that the same potential as the source potential is not set to the power source intermediate point A, but the negative side of the DC power source 12.

When the gate signal G1 (ON-driving element 13) is set to OFF and the gate signal G2 (OFF-driving element 14) is set to ON, zero-voltage is applied to the gate of the driving target device SW, and thus the driving target device SW is kept to an off-state. On the other hand, when the gate signal G1 (ON-driving element 13) is set to ON and the gate signal G2 (OFF-driving element 14) is set to OFF, the ON-voltage VG supplied form both the DC power sources 11, 12 is applied to the gate of the driving target device SW, so that the driving target device SW is kept to the ON-state.

In the gate driving circuit 1c of this embodiment thus constructed, the ON-driving element 13, the OFF-driving element 14 and the auxiliary driving element 16 are subjected to on/off control as in the case of the gate driving circuit 1 of the first embodiment. However, the OFF-voltage is not equal to −VG, but it is equal to zero voltage.

Accordingly, the gate driving circuit 1c of this embodiment is suitably applicable particularly to a case where the driving target device SW is MOSFET. In addition, the same effect as the gate driving circuit 1 of the first embodiment can be achieved.

Fifth Embodiment

Next, a fifth embodiment of the present invention will be described.

In this embodiment, a MOSFET driven with a single-polarity driving signal (gate voltage Vg) is used as the driving target device SW as in the case of the fourth embodiment.

Figure 13B:
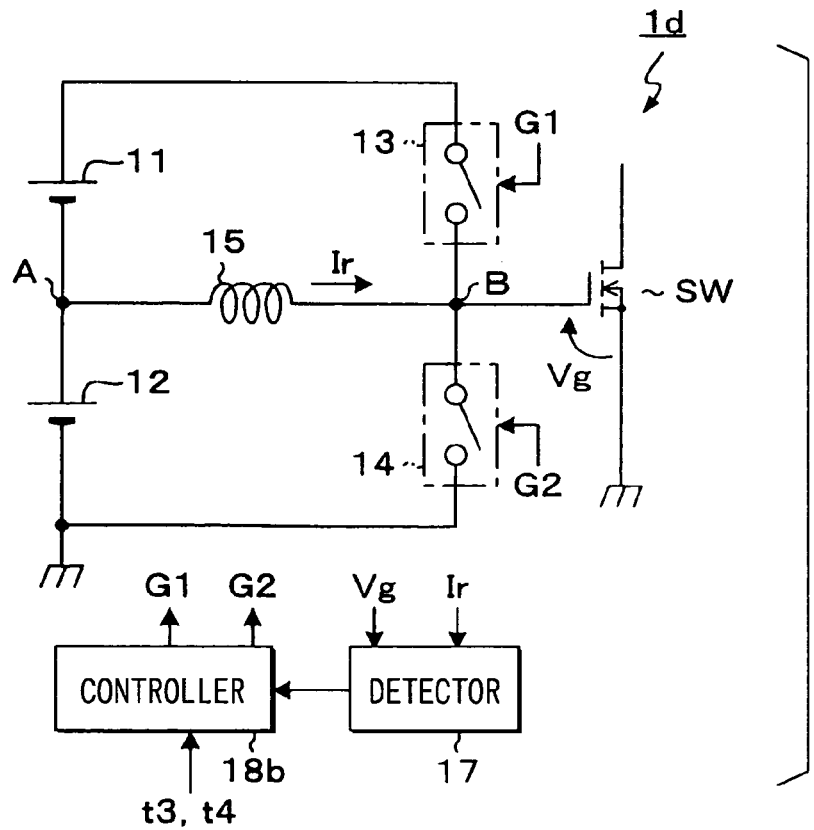

As shown in FIG. 13B, the gate driving circuit 1d of this embodiment is designed to have the same construction as the gate driving circuit 1b of the third embodiment except that the same potential as the source potential is not set to the power source intermediate point A, but set to the negative side of the DC power source 12.

When the gate signal G1 (ON-driving element 13) is set to OFF and the gate signal G2 (OFF-driving element 14) is set to ON, zero-voltage is applied to the gate of the driving target element SW, and thus the driving target device SW is kept to the OFF-state. On the other hand, when the gate signal G1 (ON-driving element 13) is set to ON and the gate signal G2 (OFF-driving element 14) is set to OFF, the ON-voltage VG supplied from both the DC power sources 11, 12 is applied to the gate of the driving target device SW, and the driving target device SW is kept to the ON-state.

In the gate driving circuit 1d of this embodiment thus constructed, the ON-driving element 13 and the OFF-driving element 14 are subjected to ON/OFF control as in the same manner as the gate driving circuit 1b of the third embodiment. However, the OFF-voltage is not equal to −VG, but zero voltage.

Accordingly, the gate driving circuit 1d of this embodiment is suitably applicable particularly to a case where the driving target device SW is MOSFET. In addition, the same effect as the gate driving circuit of the third embodiment can be achieved.

Sixth Embodiment

Next, a sixth embodiment of the present invention will be described.

In this embodiment, MOSFET which is driven with a single-polarity driving signal (gate voltage Vg) is used as the driving target device SW as in the case of the fourth and fifth embodiments.

A gate driving circuit 1e of this embodiment is different in a part of the construction from the gate driving circuit 1d of the fifth embodiment, and thus only the different point in construction will be mainly described.

Figure 14:
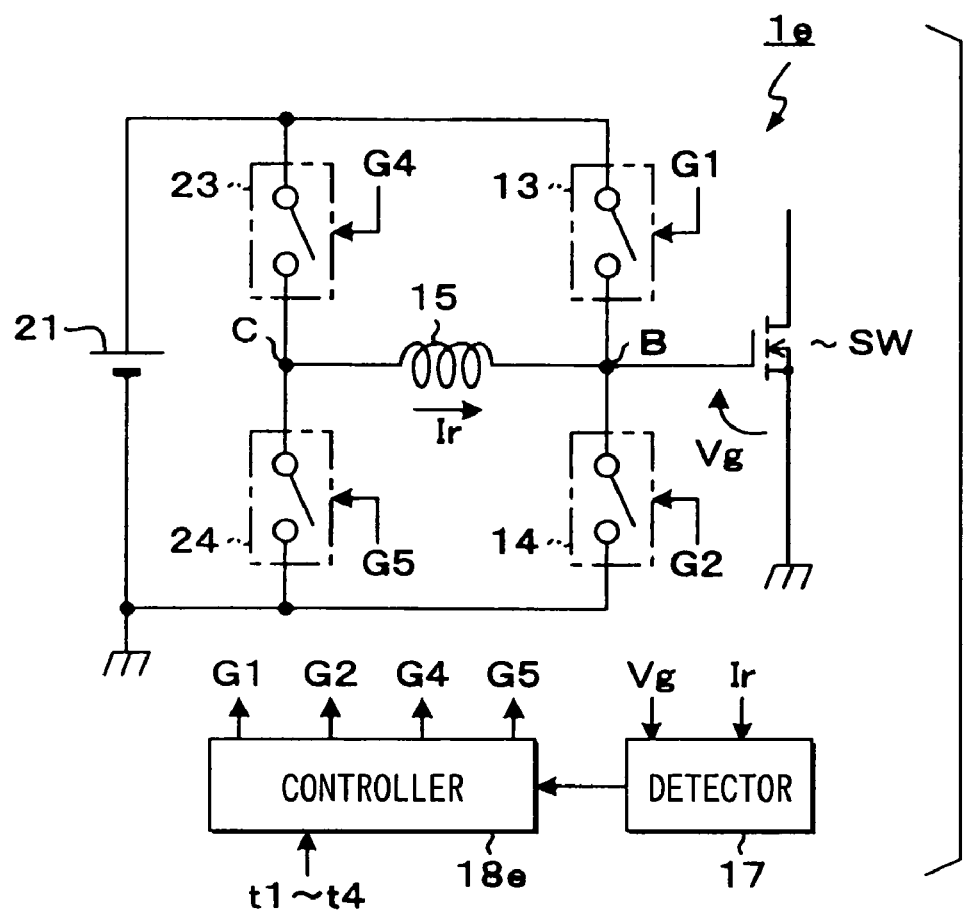
FIG. 14 is a circuit diagram showing the construction of a gate driving circuit according to a sixth embodiment.

As shown in FIG. 14, the gate driving circuit 1e of this embodiment is equipped with a single DC power source 21 (voltage VG) in place of the pair of DC power sources 11, 12, and the negative side of the DC power source 21 is set to the same potential as the source potential of the driving target device SW. One end C of the reactor 15 (hereinafter referred to as "control end C") connected to the power source intermediate point A is connected to a switching element (hereinafter referred to as "first control element") 23 for connecting the control terminal C to the positive side of the DC power source 21 and a switching element (hereinafter referred to as "second control element") 24 for connecting the control terminal C to the negative side of the DC power source 21.

Furthermore, a controller 18e generates dedicated gate signals G4, G5 different form the gate signals G1, G2 as driving signals for the first control element 23 and the second control element 24. Here, the switching control processing will be described with reference to the flowchart of FIG. 15, the timing chart of FIG. 16 and the diagrams of FIGS. 17A–17F.

When this processing is started, the gate signals G1, G4 and G5 are first initialized to OFF while the gate signal G2 is initialized to ON, and a timer for counting the switching timing of the gate signals G1 to G5 is started (S510).

Figure 17A:
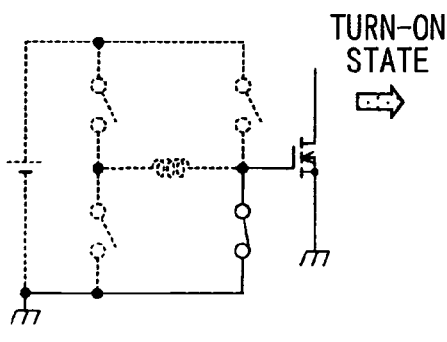
FIGS. 17A–17F are diagrams showing the operation of the gate driving circuit of the sixth embodiment.

At this time, as shown in FIG. 17A, the ON-driving element 13, the first control element 23 and the second control element 24 are kept to the OFF-state and the OFF-driving element 14 is kept to the ON-state, so that the driving target device SW is kept to a state where the zero-voltage corresponding to the OFF-voltage is applied to the gate of the driving target device SW through the OFF-driving element 14.

The processing is on standby until the time t1–t3 calculated from the set times t1, t3 has elapsed while monitoring the timer (S520), and if the time t1–t3 has lapsed (timing T1), the first control element 23 is turned on by setting the gate signal G4 to ON (S530).

Figure 17B:
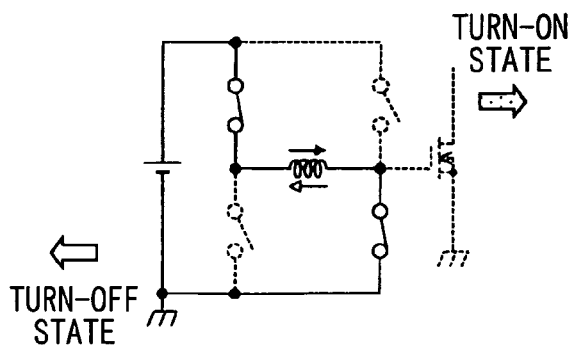

At this time, a closed circuit comprising the DC power source 21, the first control element 23, the reactor 15 and the OFF-driving element 14 is formed as shown in FIG. 17B, and reactor current Ir flows in the reactor 15 in the direction from the control end C to the output point B, and the absolute value |Ir| of the reactor current increases linearly with time lapse.

Thereafter, it is judged by monitoring the time whether the set time t1 has elapsed from the time when the gate signal G2 is set to ON (S540). If the set time t1 has not yet lapsed, the processing is kept on standby.

Figure 17C:
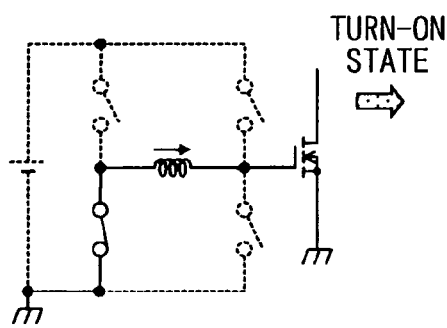

When the set time t1 has elapsed (timing T2), by setting the gate signals G2, G4 to OFF and setting the gate signal G5 to ON, the OFF-driving element 14 and the first control element 23 are turned off and the second control element 24 is turned on (S550). At this time, a closed circuit (resonance circuit) comprising the second control element 24, the reactor 15 and the gate capacitance of the driving target element SW is formed as shown in FIG. 17C. By the resonance phenomenon of the resonance circuit thus formed, the reactor current Io flowing at the turn-off time of the OFF-driving element 14 is set as an initial value and gate current (reactor current Ir) larger than the initial value is made to flow, so that charging to the gate capacitance is rapidly carried out and thus the gate voltage Vg is rapidly increased.

The processing is on standby until the gate voltage Vg detected by the detector 17 reaches the ON-voltage Vg (S560). If the gate voltage Vg reaches the ON-voltage VG (timing T3), the ON-driving element 13 is turned on by setting the gate signal G1 to ON and the timer is restarted (S570).

Figure 17D:
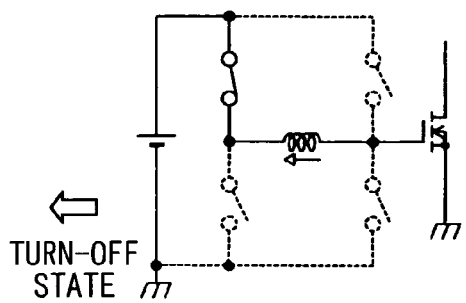
Figure 17E:
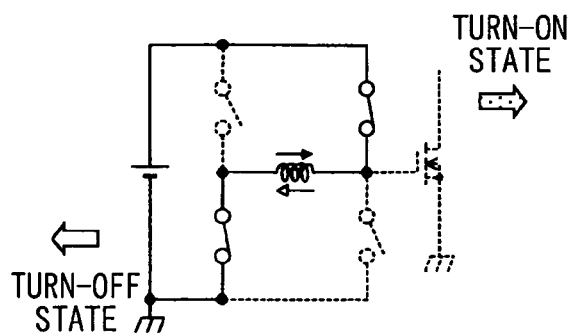

As described above, when the ON-driving element 13 is turned on, a closed circuit comprising the DC power source 21, the ON-driving element 13, the reactor 15 and the second control element 24 is formed as shown in FIG. 17E, and the reactor current Ir flows back to the DC power source 21. At this time, the absolute value |Ir| of the reactor current decreases linearly with time lapse.

Therefore, the processing is on standby until the reactor current Ir detected by the detector 17 is equal to zero (S580). When the reactor current Ir is equal to zero (timing T4), the second control element 24 is turned off by setting the gate signal G5 to OFF (S590). That is, the second control element 24 is soft-switched (that is, subjected to zero-current switching).

Figure 17F:
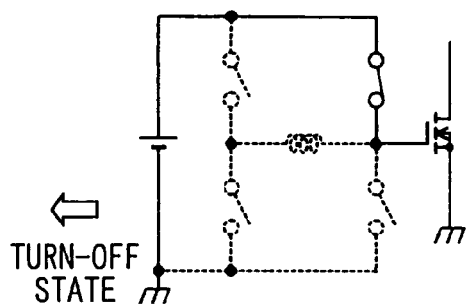

At this time, as shown in FIG. 17F, the gate of the driving target element SW is kept to a state where the ON-voltage VG from the DC power source 21 is applied thereto through the ON-driving element 13.

In S600 to S670, the same processing as S520 to S590 is carried out by making a replacement like t1→t2, t3→t4, G1→G2, G2→G1, G4→G5, G5→G4.

That is, the processing is on standby until the time t2–t4 calculated from the set times t2, t4 has elapsed while monitoring the timer (S600). If the time t2–t4 has elapsed (timing T5), the second control element 24 is turned on by setting the gate signal G5 to ON (S610).

At this time, a closed circuit comprising the DC power source 21, the ON-driving element 13, the reactor 15 and the second control device 24 is formed as shown in FIG. 17E. Therefore, the reactor current Ir flows in the reactor 15 in the direction from the output point B to the control end C, and the absolute value |Ir| of the reactor current increases linearly with time lapse.

Thereafter, it is judged by monitoring the timer whether the set time t2 has elapsed from the time when the gate signal G1 is set to ON (S620). If the set time t2 has not yet elapsed, the processing is kept on standby.

When the set time t2 has elapsed (timing T6), the gate signals G1, G5 are set to OFF and the gate signal G4 is set to ON to turn off the ON-driving element 13 and the second control element 24 and turn on the first control element 23 (S630). At this time, a closed circuit (resonance circuit) comprising the gate capacitance, the reactor 15, the first control element 23 and the DC power source 21 is formed as shown in FIG. 17D. The reactor current −Io flowing at the time when the ON-driving element 13 is turned off is set as an initial value, and the gate current (reactor current Ir) larger than the absolute value of the initial value is made to flow by the resonance phenomenon of the resonance circuit, so that the gate capacitance is rapidly discharged with the opposite polarity to that in S550, and thus the gate voltage Vg decreases quickly.

The processing is on standby until the gate voltage Vg detected by the detector 17 reaches the OFF-voltage GND (S640). If the gate voltage Vg reaches the OFF-voltage GND (timing T7), the gate signal G2 is set to ON to turn on the OFF-driving element 14, and also the timer is restarted (S650).

When the OFF-driving element 14 is turned on as described above, a closed circuit comprising the DC power source 21, the first control element 23, the reactor 15 and the OFF-driving element 14 is formed as shown in FIG. 17B, and the reactor current Ir flows back to the DC power source 21. At this time, the absolute value |Ir| of the reactor current decreases linearly with time lapse.

Therefore, the processing is on standby until the reactor current Ir detected by the detector 17 is equal to zero (S660). If the reactor current Ir is equal to zero (timing T8), the turning off the first control element 23 by setting the gate signal G4 to OFF (S670), and then the processing returns to S520. That is, the first control element 23 is soft-switched (subjected to zero-current switching).

At this time, as shown in FIG. 17A, the gate of the driving target device SW is kept to a state where the OFF-voltage GND is applied thereto through the OFF-driving element 14, that is, the state returns to the same state when S510 is executed.

Accordingly, the gate driving circuit 1e of this embodiment is suitably applicable to a case where the driving target device SW is MOSFET as in the case of the fourth and fifth embodiments, and also the same effect as the gate driving circuit 1 of the first embodiment can be achieved.

Seventh Embodiment

Next, a seventh embodiment of the present invention will be described.

A gate driving circuit 1f of this embodiment is different from the gate driving circuit 1e of the sixth embodiment in a part of the construction. The same constituent elements as the sixth embodiment are represented by the same reference numerals, and the description thereof is omitted. Therefore, only the different point in construction will be mainly described.

Figure 18A:
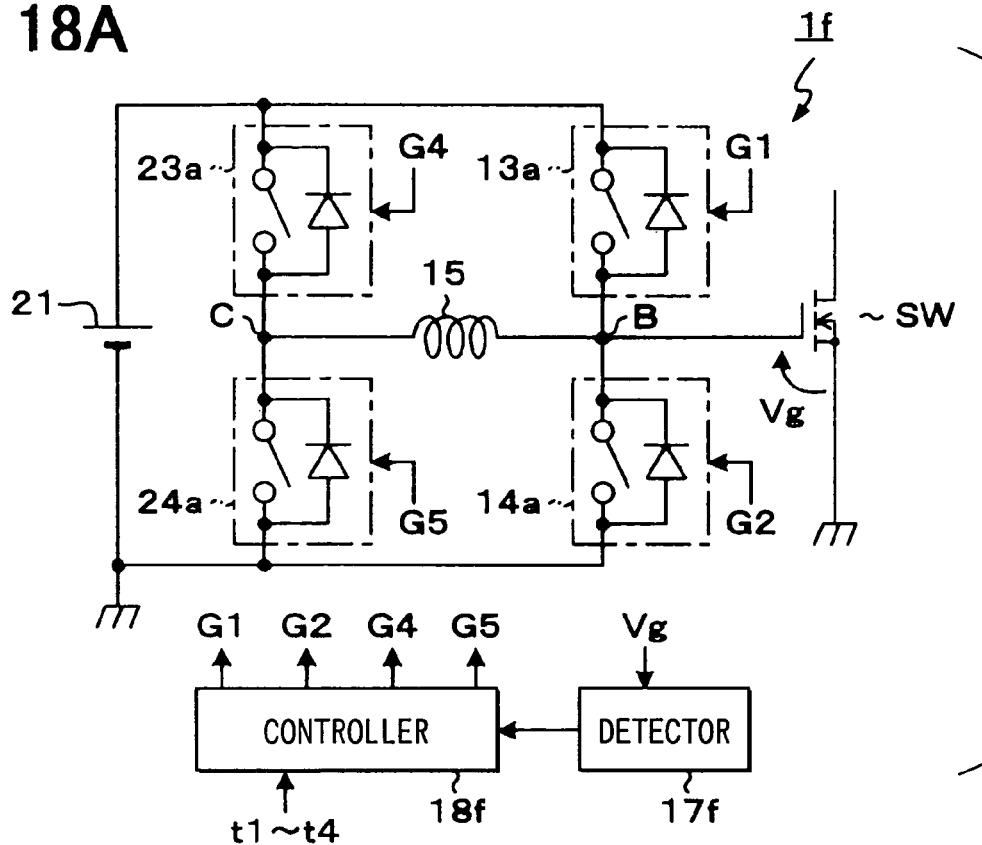
FIGS. 18A–18E are circuit diagrams showing the construction of a gate driving circuit according to a seventh embodiment.

As shown in FIG. 18A, the gate driving circuit 1f of this embodiment is equipped with an ON-driving element 13a, an OFF-driving element 14a, a first control element 23a and a second control element 24a which are designed so that an anti-parallel diode is connected to or installed in each of these elements.

A detector 17f detects only the gate voltage Vg, and a controller 18f executes the switching control processing of generating the gate signals G1, G2, G4, G5 on the basis of the gate voltage Vg and set times t1 to t4.

Figure 15:
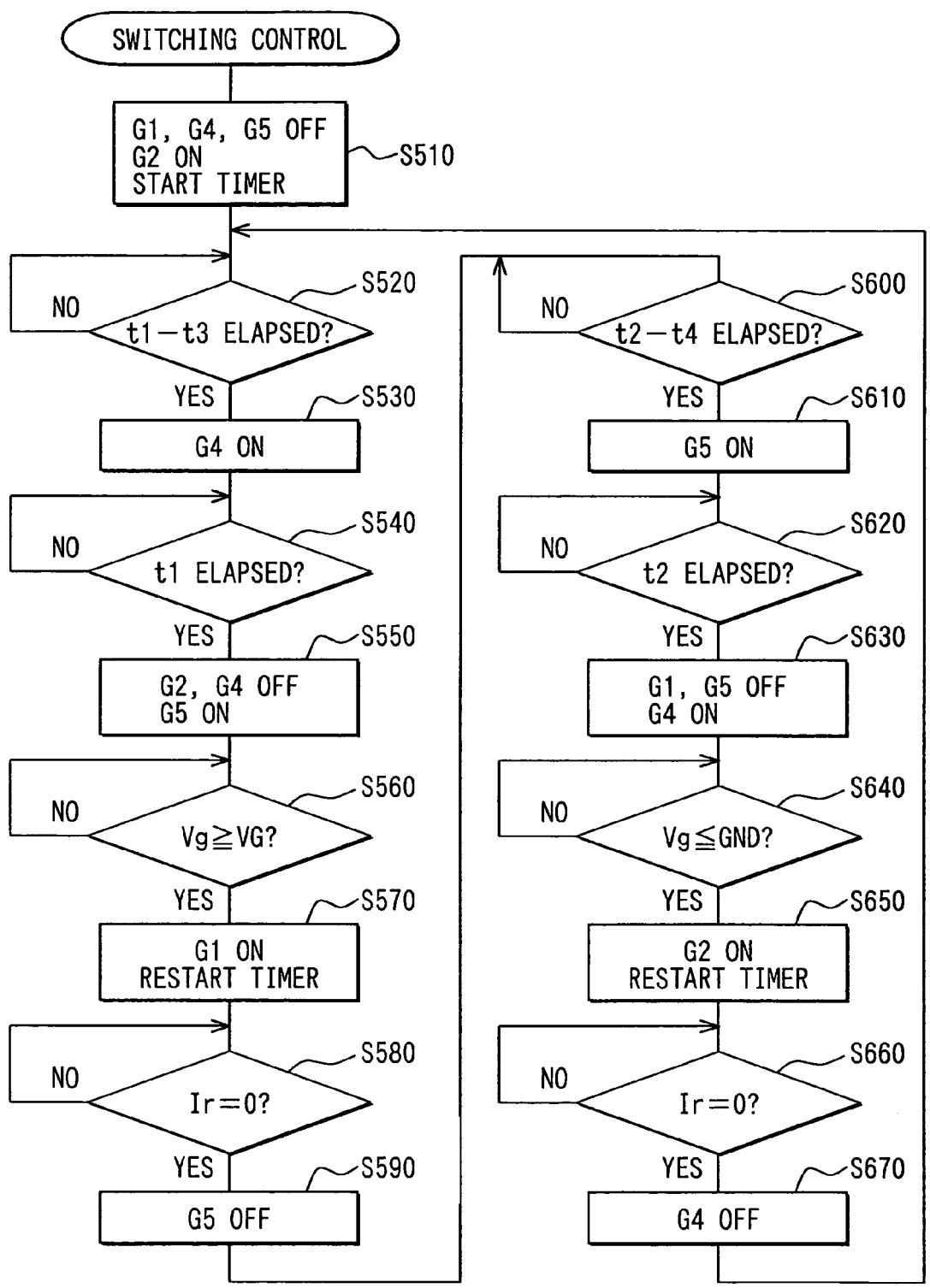
FIG. 15 is a flowchart showing the content of switching control processing executed by a controller in the sixth embodiment.
Figure 16:
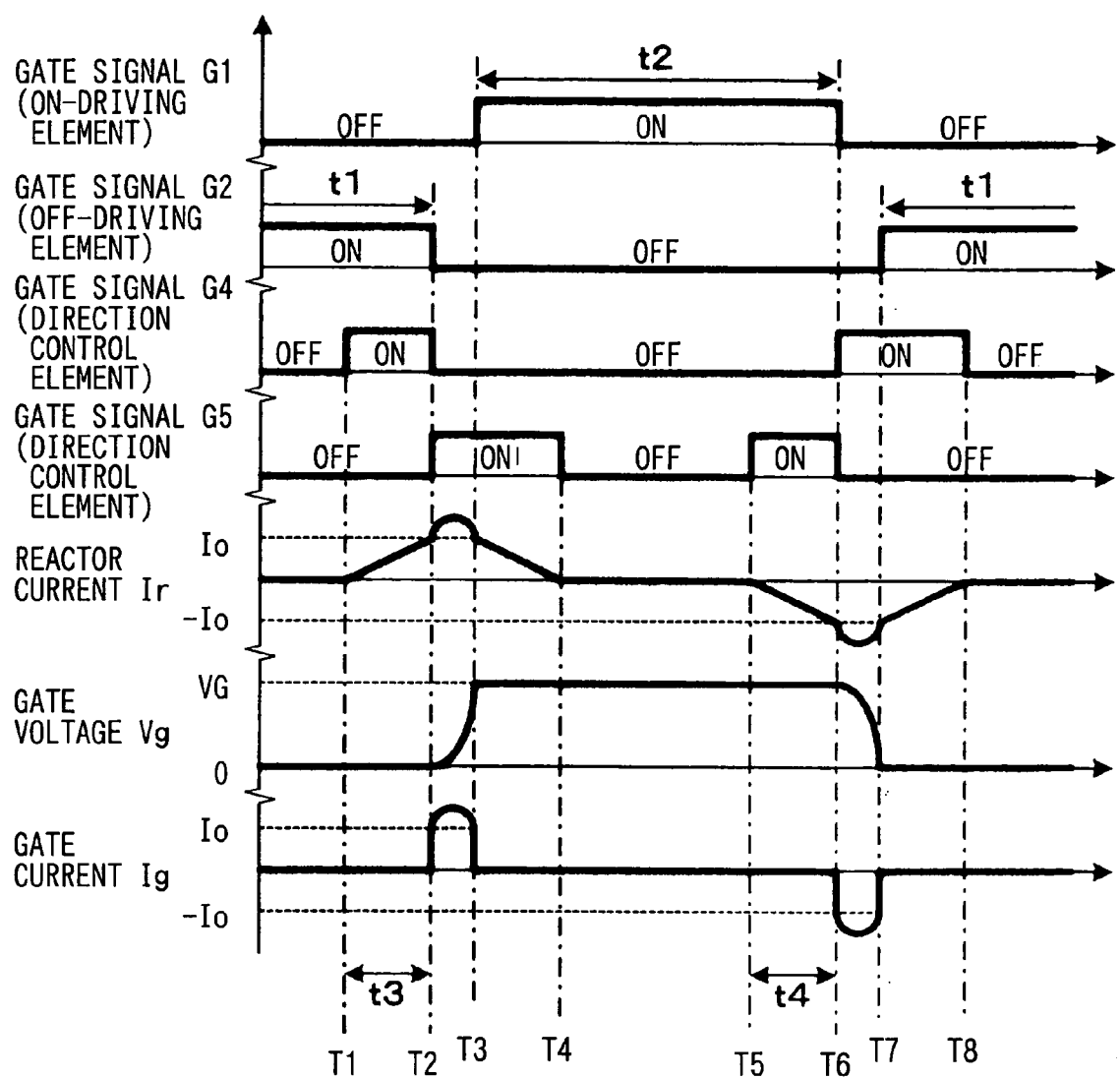
FIG. 16 is a timing chart showing gate signals generated by the controller and voltage and current waveforms of respective parts of the gate driving circuit in the sixth embodiment.

Specifically, in the flowchart of FIG. 15, S580, S590, S660, S670 are deleted, and the operation of the gate signal G5 in S550 and the operation of the gate signal G4 in S630 are deleted.

Figure 19:
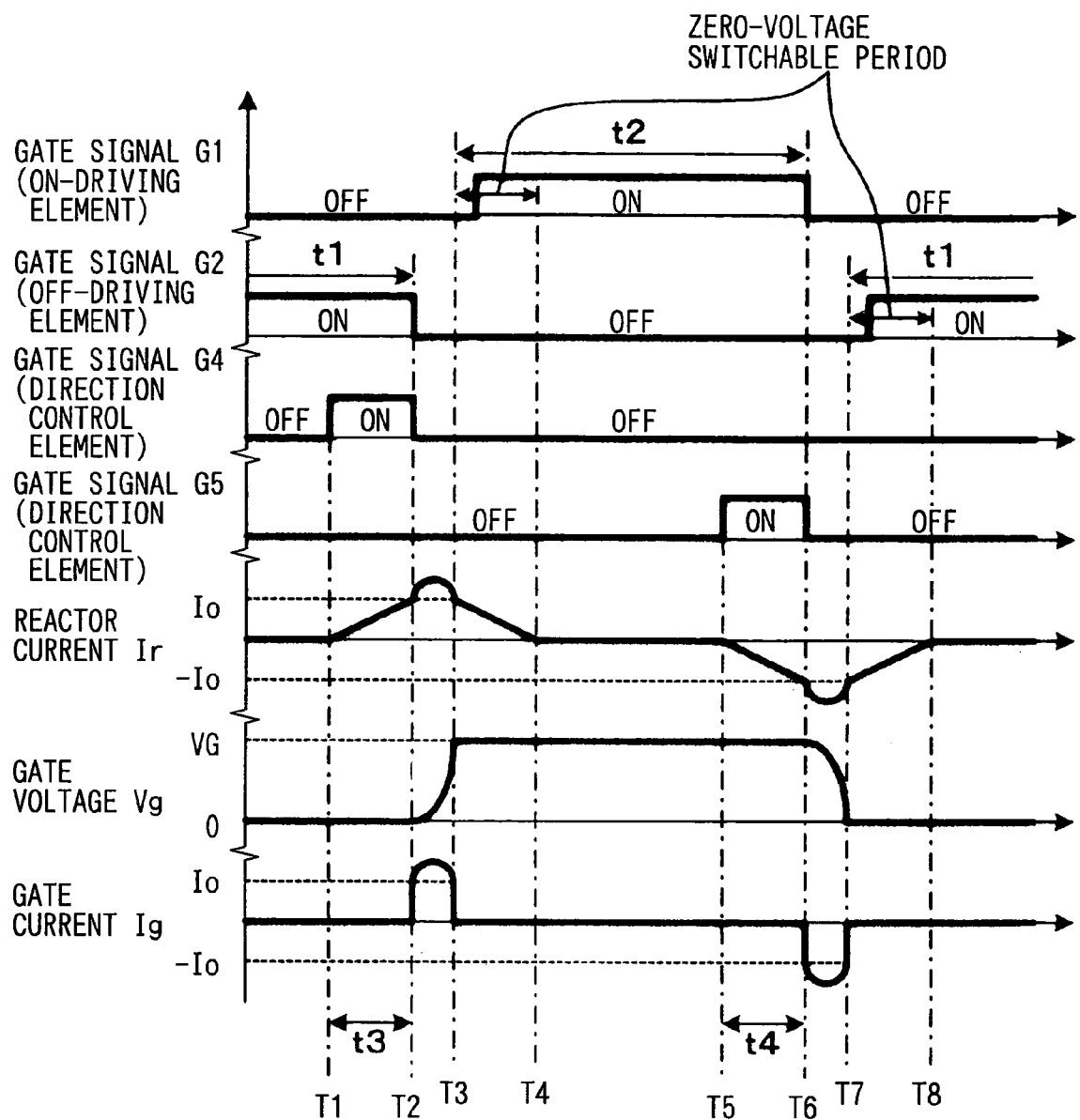
FIG. 19 is a timing chart showing gate signals generated by the controller and voltage and current waveforms of respective parts of the gate driving circuit in the seventh embodiment.

That is, as shown in FIG. 19, the gate signal G5 of the timings T2 to T4 and the gate signal T4 of the timings T6 to T8 are omitted as compared with the sixth embodiment. The gate driving circuit 1f of this embodiment thus constructed is operated in the same manner as the sixth embodiment except for the following case.

Figure 18B:
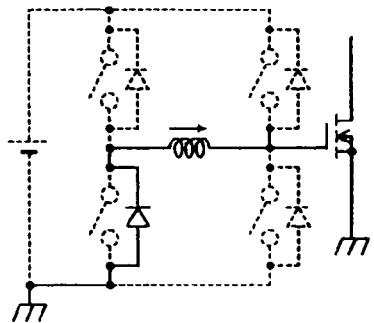
Figure 18C:
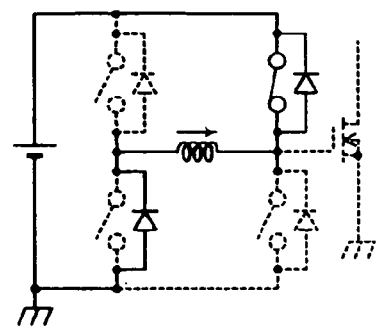

That is, in a series of operations of turning on the driving target device SW, the gate signal G5 (the second control element 24a) is kept to OFF when the resonance circuit is formed, so that the state shown in FIG. 17C is not set, and the resonance circuit is constructed by the anti-parallel diode of the second control element 24a, the reactor 15 and the gate capacitance of the driving target device SW as shown in FIG. 18B. Thereafter, the state shown in FIG. 17E is not set, and a closed circuit comprising the anti-parallel diode of the second control element 24a, the reactor 15 and the anti-parallel diode of the ON-driving element 13a and the DC power source 21 is formed as shown in FIG. 18D, so that the reactor current Ir flows back to the DC power source 21.

Figure 18D:
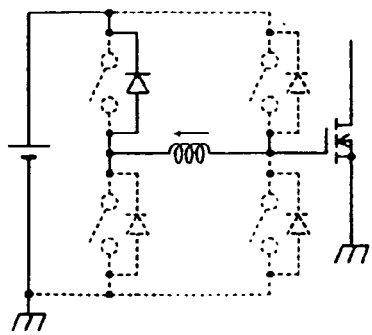
Figure 18E:
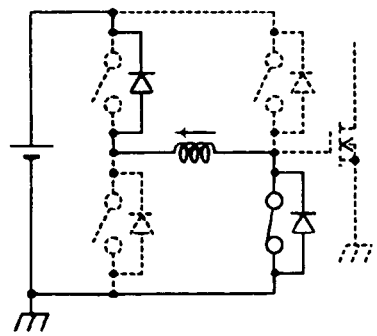

Likewise, in a series of operations of turning off the driving target device SW, the gate signal G4 (first control element 23a) is kept to OFF when the resonance circuit is constructed, so that the state shown in FIG. 17D is not set, and the resonance circuit is constructed by the gate capacitance of the driving target device SW, the reactor 15, the anti-parallel diode of the first control element 23a and the DC power source 21 as shown in FIG. 18D. Thereafter, the state of FIG. 17B is not set, and a closed circuit comprising the anti-parallel diode of the OFF-driving element 14a, the reactor 15, the anti-parallel diode of the first control element 23a and the DC power source 21 is formed as shown in FIG. 18E, so that the reactor current Ir flows back to the DC power source 21.

As described above, some elements constituting the closed circuit in the series of operations are different, however, the same operation as the gate driving circuit 1e of the sixth embodiment is carried out in the gate driving circuit 1f as a whole.

Accordingly, in the gate driving circuit 1f of this embodiment, not only the same effect as the gate driving circuit 1e of the sixth embodiment can be achieved, but also the construction of the detector 17f and the processing of the controller 18f can be simplified.

Furthermore, when the ON-driving element 13a and the OFF-driving element 14a are turned on, zero-voltage switching can be performed within a period when current flows in the anti-parallel diode (a period of Ir≠0 after the timings T3, T7) as shown in FIG. 19, and thus the switching control can be easily and surely performed.

Eighth Embodiment

Next, an eighth embodiment of the present invention will be described.

The gate driving circuit 1g of this embodiment is different from the gate driving circuit 1e of the sixth embodiment in a part of the construction, and only the different point in construction will be mainly described.

Figure 20:
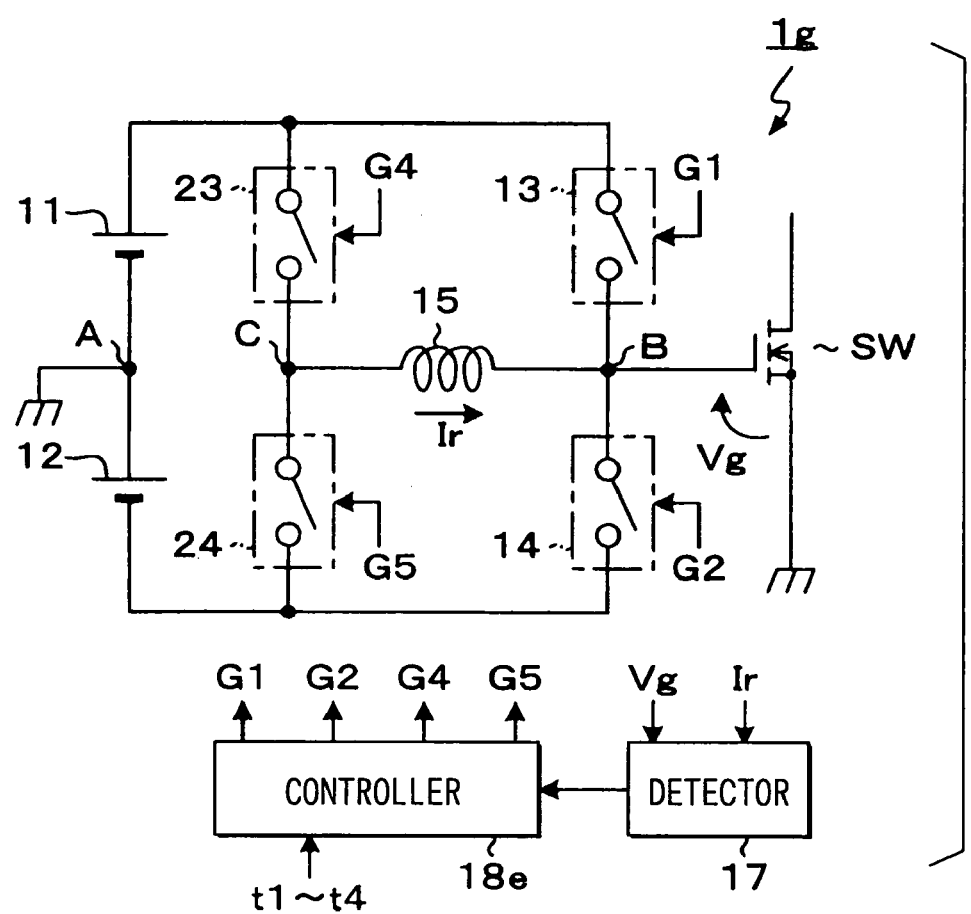
FIG. 20 is a circuit diagram showing the construction of a gate driving circuit according to an eighth embodiment.

As shown in FIG. 20, the gate driving circuit 1g of this embodiment is designed to have the same construction as the sixth embodiment except that it is equipped with a pair of DC powers 11, 12 connected to each other in series in place of the single DC power source 21 and the same potential as the source potential of the driving target device SW is set to the connection point (the power source intermediate point) A.

In the gate driving circuit 1g of this embodiment thus constructed, the switching control processing executed by the controller 18e is the same as the sixth embodiment (see FIG. 15). The operation of the gate driving circuit 1g will be described with reference to the timing chart of FIG. 21 and the diagrams of FIGS. 22A–22F.

Figure 21:
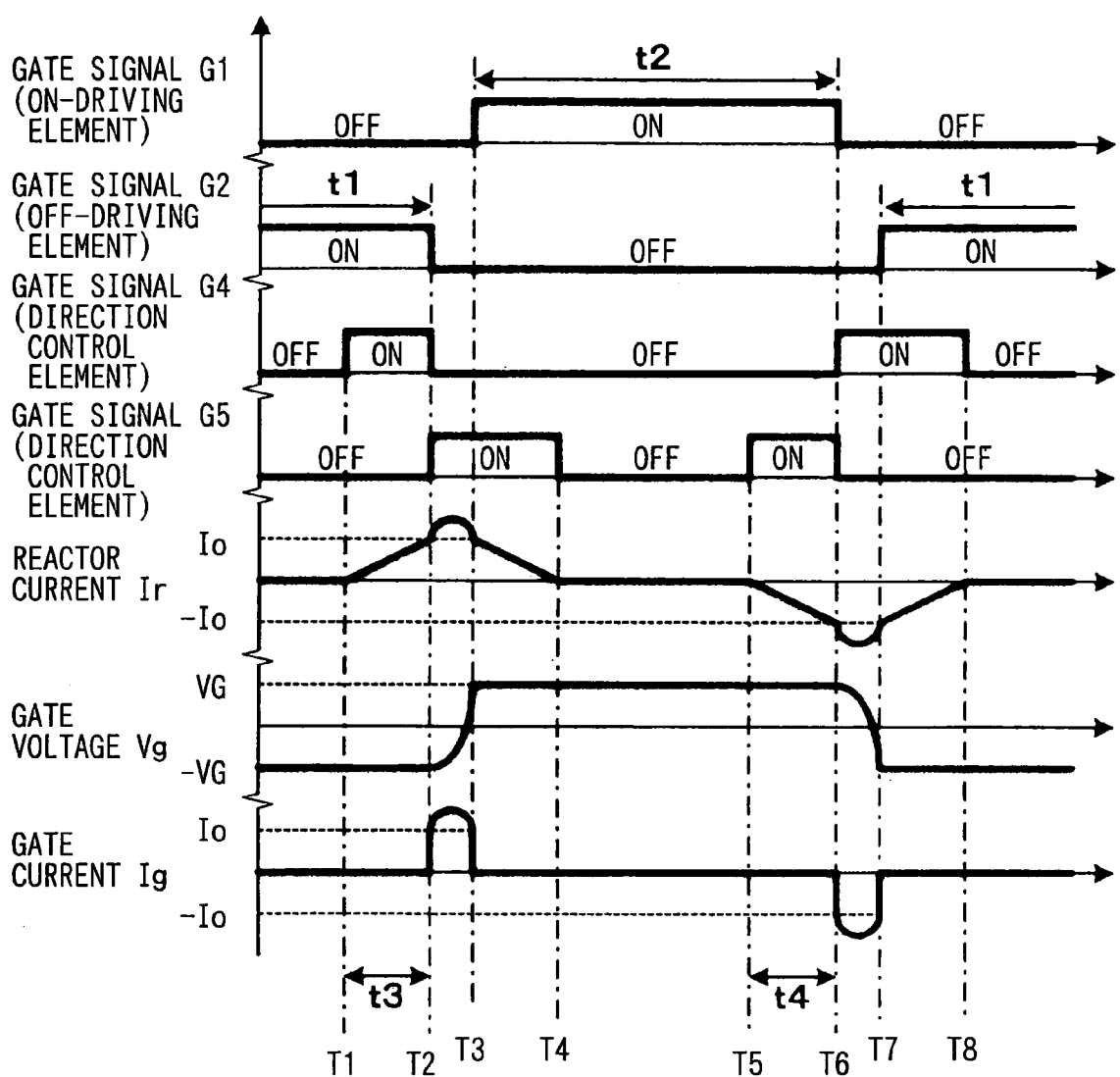
FIG. 21 is a timing chart showing gate signals generated by a controller and voltage and current waveforms of respective parts of the gate driving circuit of the eighth embodiment.
Figure 22A:
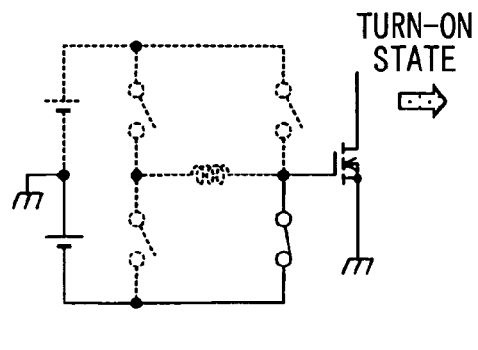
FIGS. 22A–22F are diagrams showing the operation of the gate driving circuit according to the eighth embodiment.

That is, when the switching control processing is started and S510 is executed Oust before the timing T1 of FIG. 21), the ON-driving element 13, the first control element 23 and the second control element 24 are turned off and the OFF-driving element 14 is turned on as shown in FIG. 22A, so that the gate of the driving target device SW is kept to a state where the OFF-voltage −VG from the DC power source 12 is applied thereto through the OFF-driving element 14.

Figure 22B:
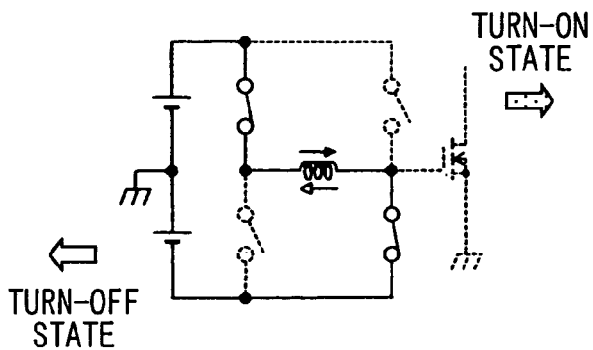

When S530 is executed (timing T1), a closed circuit comprising the DC power sources 11, 12, the first control element 23, the reactor 15 and the OFF-driving element 14 is formed as shown in FIG. 22B. The reactor current Ir flows in the reactor 15 in the direction from the control end C to the output point B, and the absolute value |Ir| of the reactor current increases linearly with time lapse. However, at this time, a voltage 2VG corresponding to the double voltage of the sixth embodiment is applied to the reactor 15.

Figure 22C:
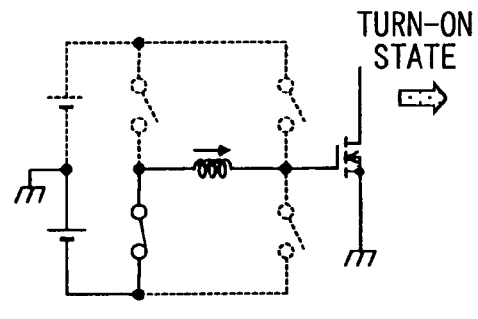

When S550 is executed (timing T2), a closed circuit (resonance circuit) comprising the DC power source 12, the second control element 24, the reactor 15 and the gate capacitance of the driving target device SW is formed as shown in FIG. 22C. The reactor current Io flowing when the OFF-driving element 14 is turned off is set as an initial value, and the gate current (reactor current Ir) larger than the initial value is made to flow by the resonance phenomenon of the resonance circuit, so that the gate capacitance is rapidly charged/discharged and the gate voltage Vg is rapidly increased.

Figure 22D:
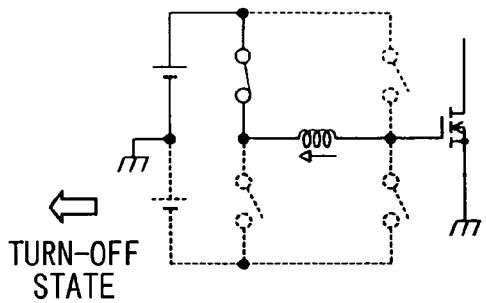
Figure 22E:
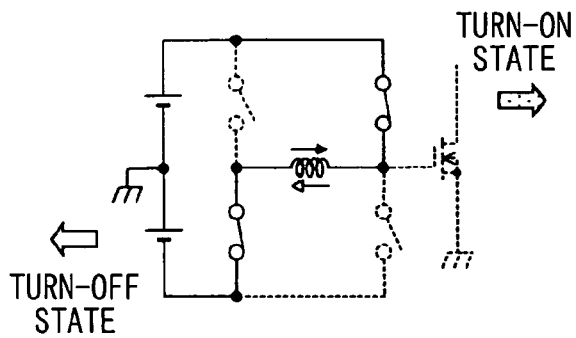

When S570 is executed (timing T3), a closed circuit comprising the DC power sources 11, 12, the ON-driving element 13, the reactor 15 and the second control element 24 is formed as shown in FIG. 22E, and the reactor current Ir flows back to the DC power sources 11, 12. At this time, the absolute value |Ir| of the reactor current decreases linearly with time lapse. At that time, a voltage of 2VG is applied to the reactor 15 in the opposite direction to that of FIG. 22B.

Figure 22F:
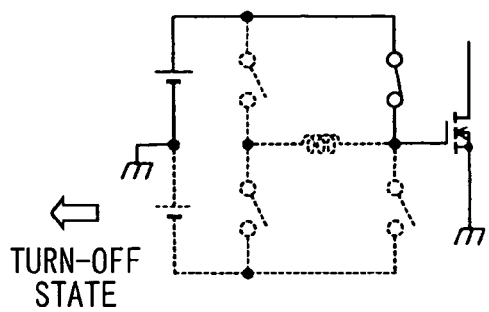

When S590 is executed (timing T4), the OFF-driving element 14, the first control element 23 and the second control element 24 are turned off as shown in FIG. 22F, and the ON-driving element 13 is turned on, so that the gate of the driving target device SW is kept to a state where the ON-voltage VG is applied thereto from the DC power source 11 through the ON-driving element 13.

When S610 is executed (timing T5), a closed circuit comprising the DC power sources 11, 12, the ON-driving element 13, the reactor 15 and the second control element 24 is formed as shown in FIG. 22E, and the reactor current Ir flows in the reactor 15 in the direction from the output point B to the control end C. The absolute value |Ir| of the reactor current increases linearly with time lapse. However, a voltage of 2VG which is twice as large as that the case of the sixth embodiment is applied to the reactor 15.

When S630 is executed (timing T6), a closed circuit (resonance circuit) comprising the gate capacitance, the reactor 15, the first control element 23 and the DC power source 11 is formed as shown in FIG. 22D. The reactor current −Io flowing when the ON-driving element 13 is turned off is set as an initial value, and the gate current (reactor current Ir) larger than the initial value is made to flow by the resonance phenomenon of the resonance circuit, so that discharging from and charging to the gate capacitance is rapidly carried out with the opposite polarity to that in S550 and thus the gate voltage Vg decreases rapidly.

When S650 is executed (timing T7), a closed circuit comprising the DC power sources 11, 12, the first control element 23, the reactor 15 and the OFF-driving element 14 is formed as shown in FIG. 22B, and the reactor current Ir flows back to the DC power sources 11, 12. At this time, the absolute value |Ir| of the reactor current decreases linearly with time lapse. AT this time, a voltage of 2VG is applied to the reactor 15 in the opposite direction to that in the case of FIG. 22E.

When S670 is executed (timing T8), as shown in FIG. 22A, the ON-driving element 13, the first control element 23 and the second control element 24 are turned off, and the OFF-driving element 14 is turned on, so that the gate of the driving target device SW is set to a state where the OFF-voltage −VG from the DC power source 12 is applied thereto from the DC power source 12 through the OFF-driving element 14, that is, the state is returned to the same state achieved in the case of the execution of S510.

As described above, the gate driving circuit 1g of this embodiment is operated in the same manner as the gate driving circuit 1e of the sixth embodiment except that the OFF-voltage applied to the gate of the driving target device SW is equal to −VG and also the voltage applied to the reactor 15 is equal to 2VG when the reactor current Ir is made to flow before the ON-driving element 13 and the OFF-driving element 14 are driven.

Accordingly, according to the gate driving circuit 1g of this embodiment, not only the same effect as the sixth embodiment can be achieved, but also the reactor current Ir can be made to flow more rapidly, so the operation of the driving target device SW can be performed at a higher speed.

Ninth Embodiment

Next, a ninth embodiment of the present invention will be described.

A gate driving circuit 1h of this embodiment is different from the gate driving circuit 1g of the eighth embodiment in a part of the construction, and thus the same elements as the eighth embodiment are represented by the same reference numerals. Therefore, the description on the same constituent elements is omitted, and only the different point will be mainly described.

Figure 23A:
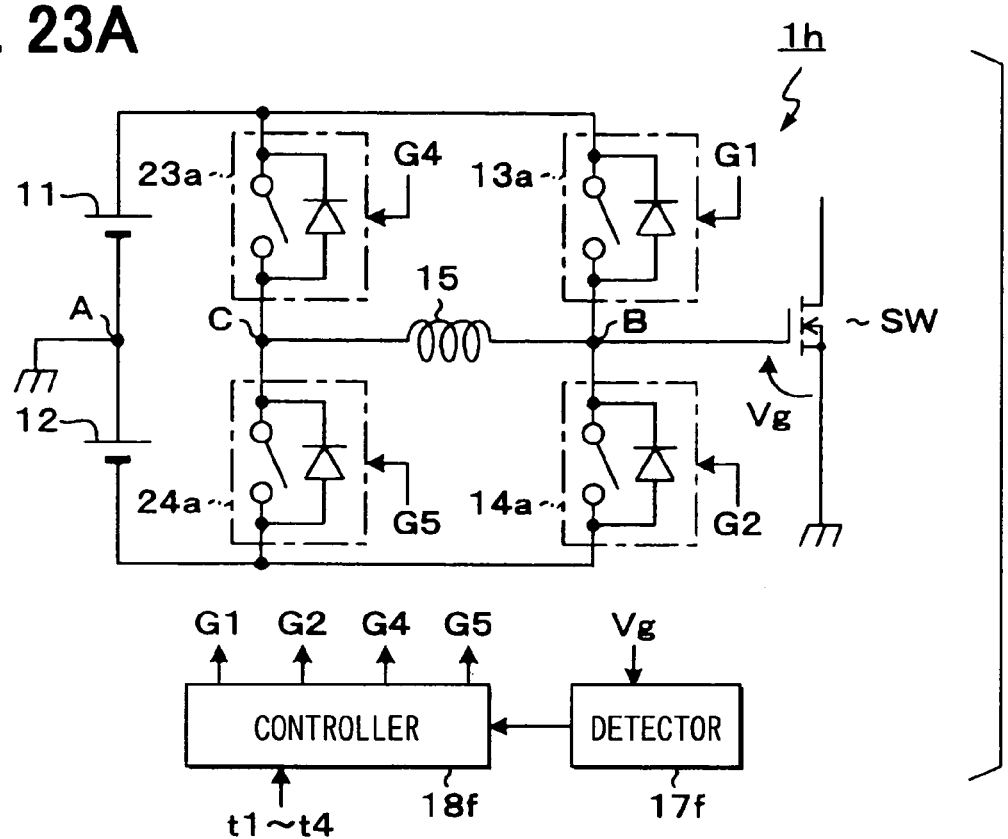
FIGS. 23A–23E is a circuit diagram showing the construction of a gate driving circuit according to an ninth embodiment.

As shown in FIG. 23A, in a gate driving circuit 1h of this embodiment, the ON-driving element 13a, the OFF-driving element 14a, the first control element 23a and the second control element 24a are designed so that an anti-parallel diode is connected to or installed in each of the above elements.

A detector 17f detects only the gate voltage Vg, and controller 18f executes the switching control processing of generating gate signals G1, G2, G4, G5 on the basis of the gate voltage Vg and the set times t1 to t4.

Specifically, S580, S590, S660, S670 in the flowchart of FIG. 15 are deleted, and further the operation of the gate signal G5 in S550 and the operation of the gate signal G4 in S630 are deleted.

Figure 24:
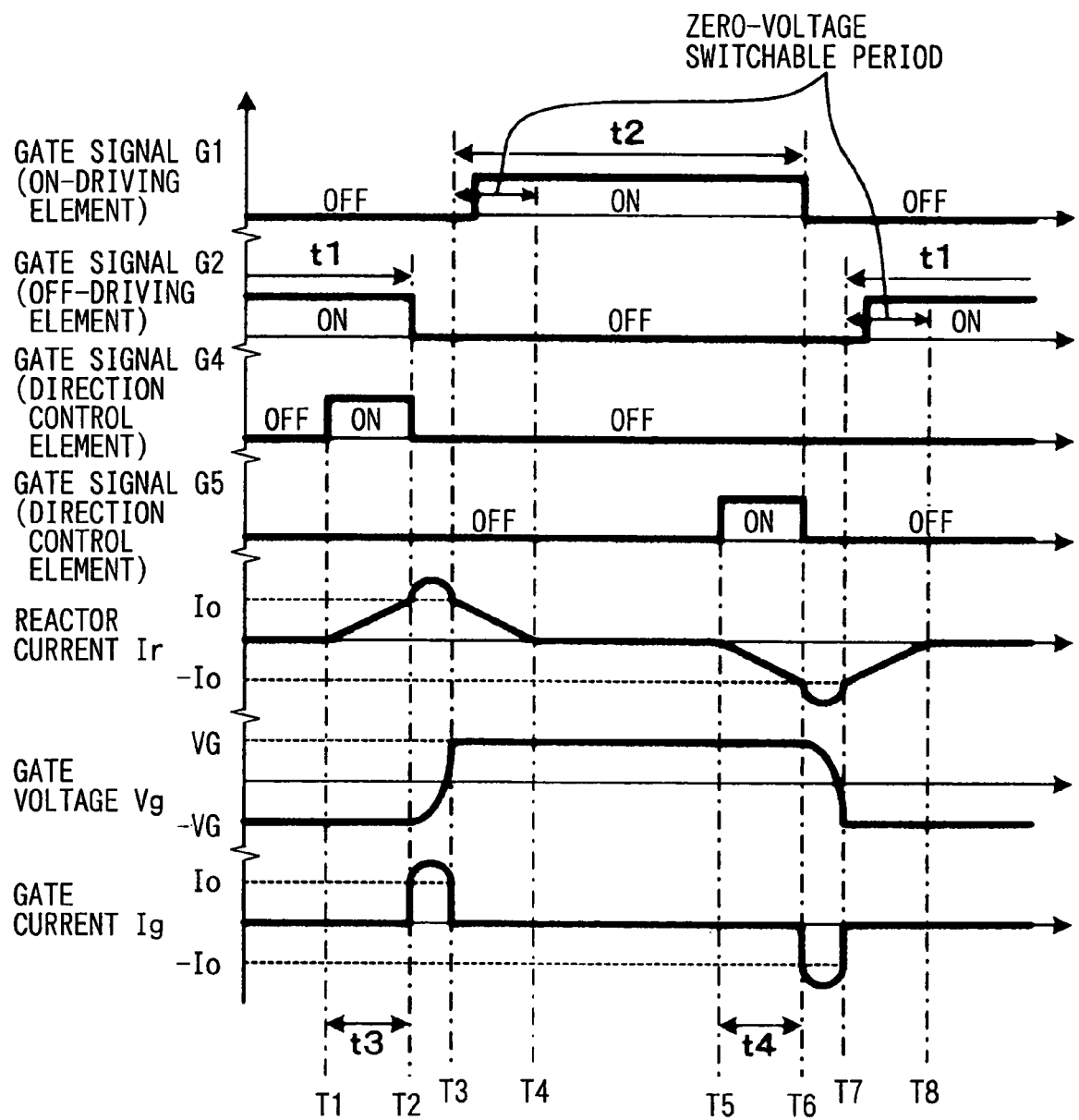
FIG. 24 is a timing chart showing gate signals generated by a controller and voltage and current waveforms of respective parts of the gate driving circuit in the ninth embodiment.

That is, as shown in FIG. 24, the gate signal G5 of the timings T2 to T4 and the gate signal G4 of the timing T6 to T8 are omitted as comparison with the case of the eighth embodiment. In the gate driving circuit 1h of this embodiment thus constructed, the same operation as the gate driving circuit 1g of the eighth embodiment is carried out except for the following case.

Figure 23B:
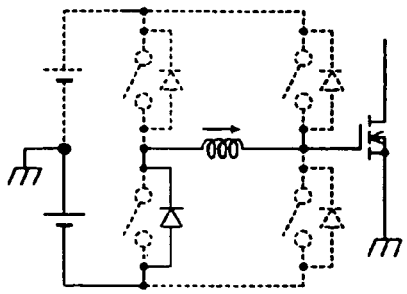
Figure 23C:
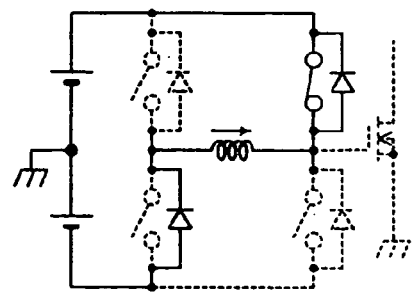

That is, in the series of operations of turning on the driving target device SW, the gate signal G5 (second control element 24a) is kept to OFF when the resonance circuit is formed, so that the state of FIG. 22C is not set and a resonance circuit is formed of the DC power source 12, the anti-parallel diode of the second control element 24a, the reactor 15 and the gate capacitance of the driving target element SW as shown in FIG. 23B. Thereafter, the state of FIG. 22E is not set, as shown in FIG. 23C, and the reactor current Ir is made to flow back to the DC power sources 11, 12 by a closed circuit comprising the anti-parallel diode of the second control element 24a, the reactor 15, the anti-parallel diode of the ON-driving element 13a and the DC power sources 11, 12.

Figure 23D:
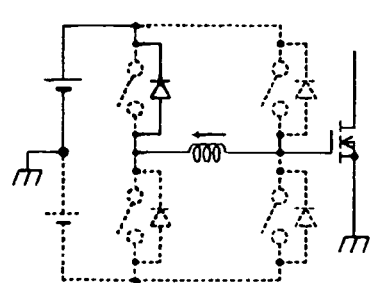
Figure 23E:
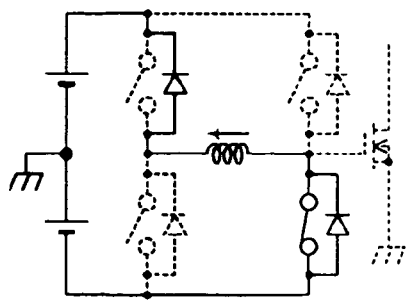

Likewise, in the series of operations of turning off the driving target device SW, the gate signal G4 (first control element 23a) is kept to OFF when the resonance circuit is formed. Therefore, the state of FIG. 22D is not set as shown in FIG. 23D, and a resonance circuit is formed of the gate capacitance of the driving target device SW, the reactor 15, the anti-parallel diode of the first control element 23a and the DC power source 11 as shown in FIG. 23D. Thereafter, the state of FIG. 22B is not set, as shown in FIG. 23E, and the reactor current Ir is made to flow back to the DC power sources 11, 12 by the closed circuit comprising the anti-parallel diode of the OFF-driving element 14a, the reactor 15, the anti-parallel diode of the first control element 23a and the DC power sources 11, 12.

As described above, some of the elements constituting the closed circuit in the series of operations are different, however, the same operation as the gate driving circuit 1g of the eighth embodiment is carried out in the gate driving circuit 1h as a whole. Accordingly, according to the gate driving circuit 1h of this embodiment, not only the same effect as the gate driving circuit 1g of the eighth embodiment can be achieved, but also the construction of the detector 17f and the processing of the controller 18f can be simplified.

Furthermore, when the ON-driving element 13a and the OFF-driving element 14a are turned on, zero-voltage switching can be performed within a period when current flows in the anti-parallel diodes (a period of Ir≠0 after the timings T3, T7) as shown in FIG. 24, so that the switching control of these elements can be easily and surely performed.

Other Embodiments

The foregoing description relates to some embodiments, and the present invention is not limited to the above-described embodiments. Various modifications and alterations may be made to the above-described embodiments, and the present invention can be implemented in various modes.

For example, in the above-described embodiments, fixed values are used as the set times t3, t4. However, they may be set to be variable in accordance with the voltages of the DC power sources 11, 12.

Furthermore, according to the above-described embodiments, the controllers 18, 18b, 18e, 18f generate the gate signals G1 to G5 through the processing of the microcomputer, however, these controllers may be designed so that the gate signals G1 to G5 are generated by hardware.

Furthermore, the controllers 18, 18b, 18e, 18f generate the gate signals G1 to G5 by using the detection results of the detectors 17, 17f. The detectors 17, 17f may be omitted by providing each time parameter in the controllers 18, 18b, 18e, 18f.

In the above embodiment, the detectors 17, 17f are constructed so as to detect the gate voltage Vg and the reactor current Ir, however, they may be designed so as to detect other voltage and current. In this case, the controllers 18, 18b, 18e, 18f generate the gate signals G1 to G5 on the basis of the detection results of the detectors.

In the first to third embodiments, the description is made by setting the driving target element SW to IGBT. However, the gate driving circuits 1, 1a, 1b of the first to third embodiments may be applied to a case where the driving target element SW is FET.

The operations shown in FIGS. 5A–5B and 6A–6B are not limited to the gate driving circuit 1 of the first embodiment, but may be applied to the other gate driving circuits 1a, 1c, 1e to 1h except for the gate driving circuits 1b, 1d of the third and fifth embodiments.

Furthermore, in the above-described embodiments, when the driving target element SW is FET, FET is assumed to be an N-channel type. However, it may be a P-channel type.

The auxiliary driving element 16 is not necessarily required to be constructed by a single element. For example, a pair of transistors (in this case, N-channel MOSFETs) to which anti-parallel diodes are connected or in which anti-parallel diodes are installed may be connected to each other in series so that the anti-parallel diodes are arranged in the opposite directions to each other, thereby constructing the auxiliary driving element 16.

Figure 25A:
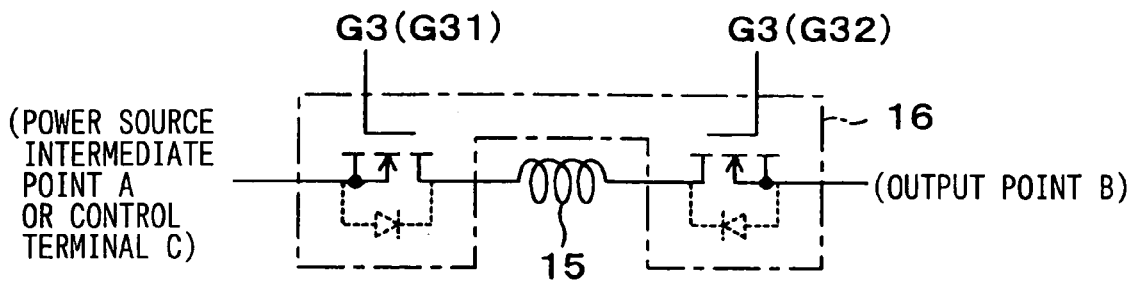
FIGS. 25A–25E are diagrams showing an arrangement method when an auxiliary driving element is constructed by a pair of MOSFETs.

Specifically, a pair of transistors constituting the auxiliary driving element 16 may be arranged so as to sandwich the reactor 15 therebetween as shown in FIG. 25A, or they may be arranged so as to be located together at any one side of the reactor 15 as shown in FIGS. 25B to 25E. When they are arranged so as to sandwich the reactor 15 therebetween as shown in FIG. 25A, both the transistors are preferably arranged so that the drains thereof are connected to the reactor 15.

Figure 25B:
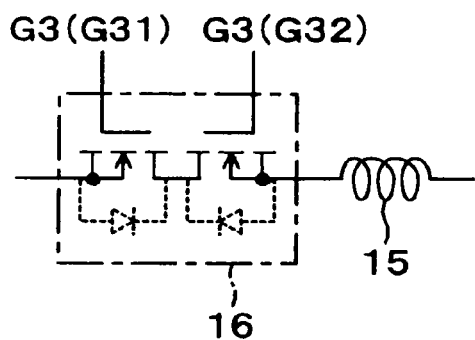
Figure 25C:
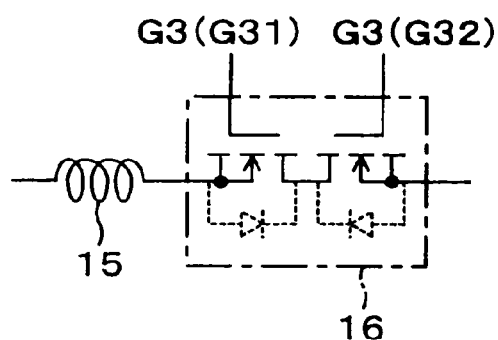
Figure 25D:
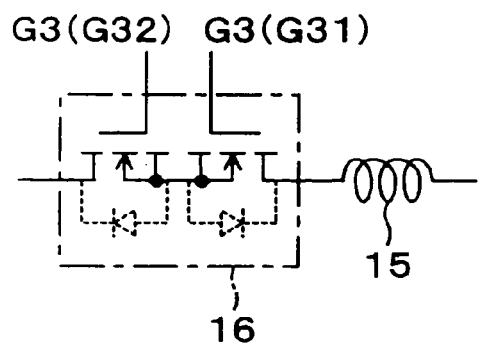
Figure 25E:
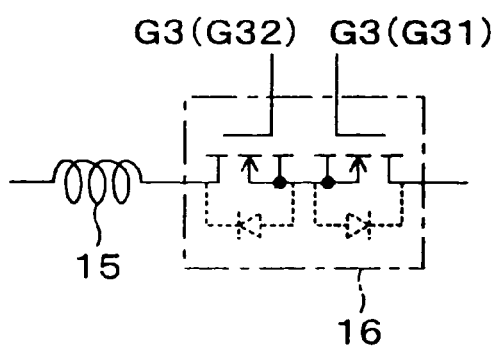

Furthermore, when a pair of transistors are arranged so as to be located together at one side of the reactor 15, they may be arranged so that the drains thereof are connected to each other as shown in FIGS. 25B and 25C. Further, they may be arranged so that the sources thereof are connected to each other as shown in FIGS. 25D and 25E.

The arrangement of the transistors constituting the auxiliary driving element 16 is suitably selected so as to minimize the types of power sources to be prepared to generate the gate signals G1 to G5 for driving these transistors. That is, the gate signals G1 to G5 are required to be generated with a power source which is based on the source potential of the transistors to be driven, and the gate driving circuit is desirably designed so that a common power source to the elements containing elements used in the ON-driving element 13, the OFF-driving element 14, the first control element 23 and the second control element 24 can be used as much as possible.

Figure 26A:
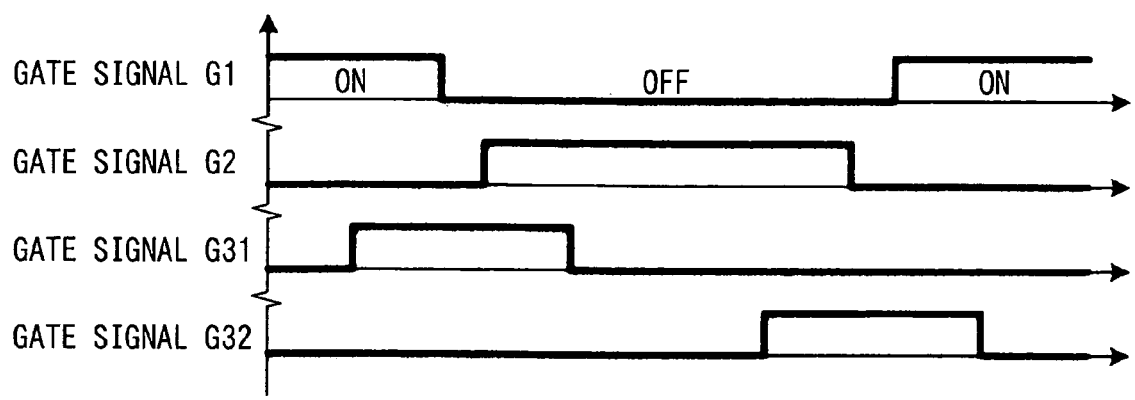
FIGS. 26A and 26B are timing charts showing a method of driving the auxiliary driving element comprising a pair of MOSFETs.
Figure 26B:
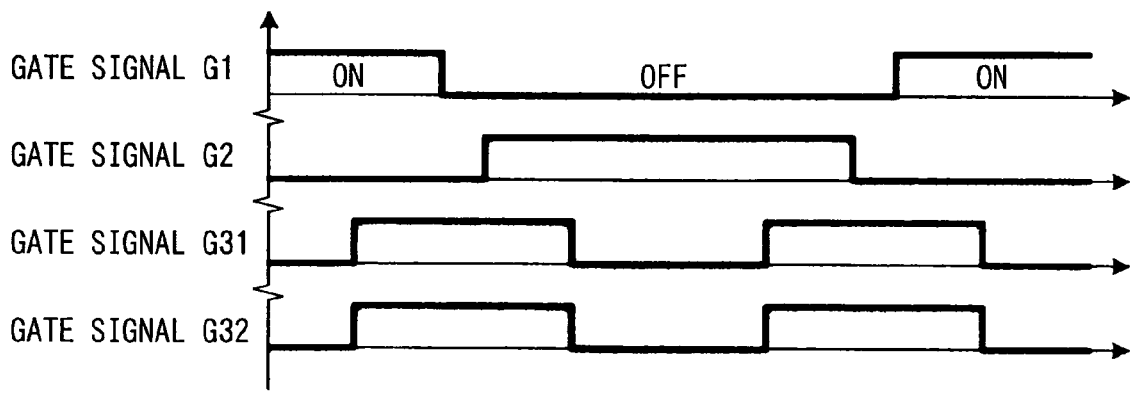

As shown in FIG. 26A, both the transistors constituting the auxiliary driving element 16 may be controlled so that any one of the transistors is turned on by using different gate signals G31 and G32, or so that they are turned on/off at the same time by using the same control signal as shown in FIG. 26B.

In the former case, even when any transistor is turned on, current flows through the anti-parallel diode of the turn-off transistor, the reactor 15 and the turn-on transistor, and the current flowing direction can be reversed by inverting the turn-on/off state of the transistor.

In the latter case, since no current flows in the anti-parallel diodes, and thus the loss in the auxiliary driving element 16 can be reduced. That is, the loss is lower in the case where the transistors are turned on so that current flows in the transistors than in the case where current is made to flow in the anti-parallel diodes.

Figure 27A:
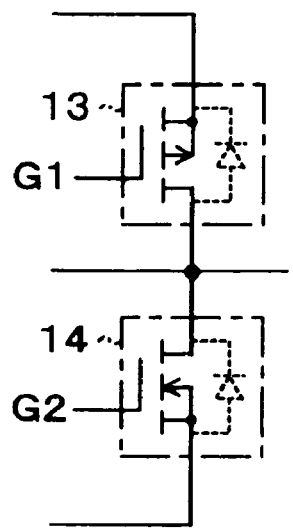
FIGS. 27A–27D are diagrams showing a specific construction method of both elements comprising a driving device unit.
Figure 27B:
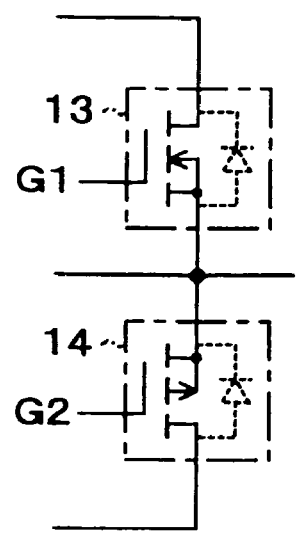
Figure 27C:
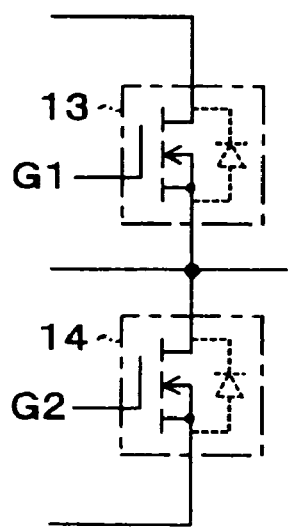
Figure 27D:
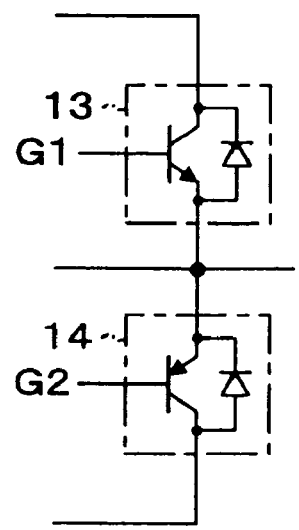
Figure 28:
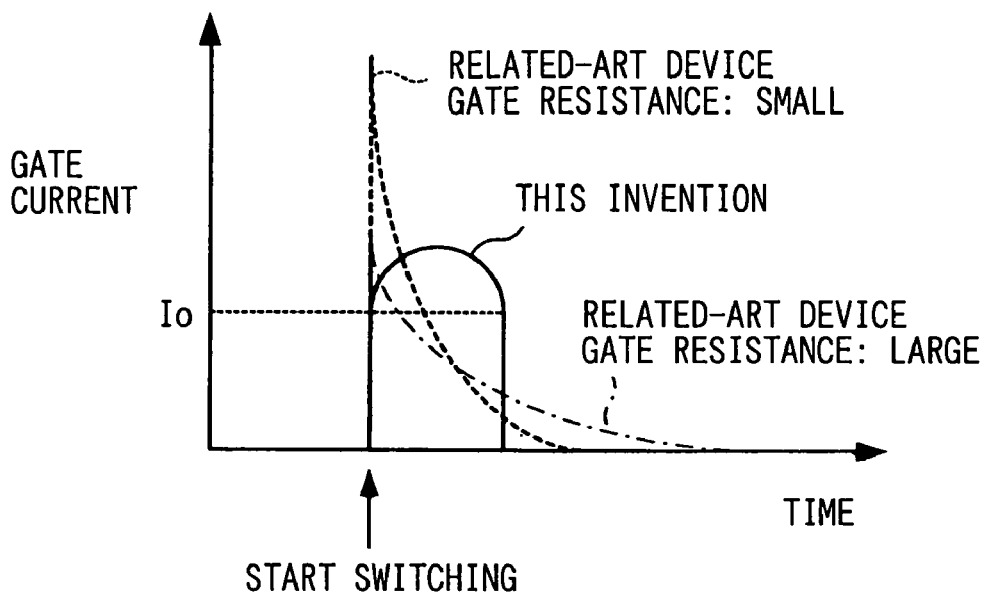
FIG. 28 is a diagram showing the waveform of gate current of a related-art device and the waveform of gate current of the present invention.
Figure 29:
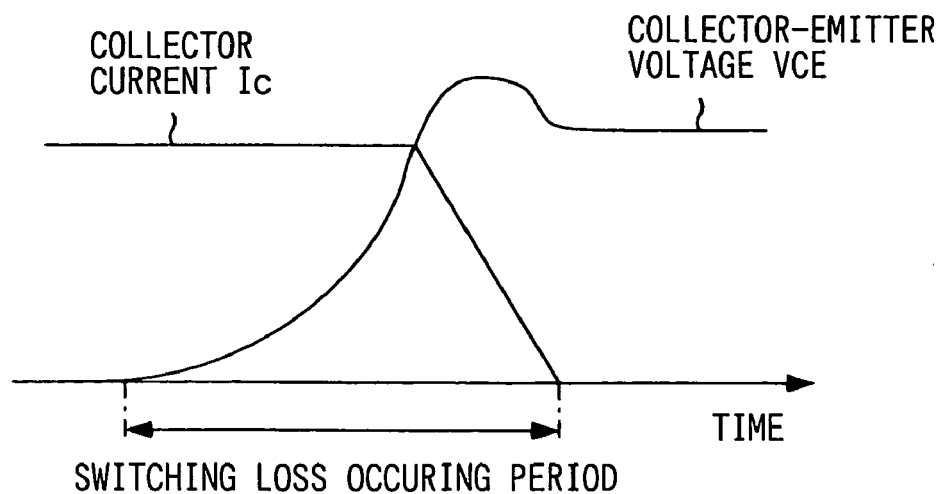
FIG. 29 is a diagram showing a switching operation of a switching element.

Both the elements 13, 14 constituting the driving element unit may be designed so that the ON-driving element 13 comprises a P-channel MOSFET and the OFF-driving element 14 comprises an N-channel MOSFET as shown in FIG. 27A, or so that the ON-driving element 13 comprises an N-channel MOSFET and the OFF-driving element 14 comprises a P-channel MOSFET as shown in FIG. 27B, or so that each of the elements 13, 14 comprises an N-channel MOSFET as shown in FIG. 27C.

In the case of FIG. 27A, a power source for supply the ON-voltage may be used as a power source for generating the gate signal G1 while a power source for supplying the OFF-voltage is used as a power source for generating the gate signal G2, and thus a power source used only to generate the gate signals G1 or G2 is not further prepared.

In the case of FIG. 27B, a common power using the potential of the output point B as reference potential may be used as the power source for generating the gate signals G1, G2.

In the case of FIG. 27C, the loss when both the elements 13, 14 constituting the driving element unit are conducted can be reduced more greatly than that in FIGS. 27A and 27B.

Furthermore, bipolar transistors may be used as the elements 13, 14. In this case, it is desirable that the ON-driving element 13 is constructed by an NPN bipolar transistor to which an anti-parallel diode is connected and the OFF-driving element 14 is constructed by a PNP bipolar transistor to which an anti-parallel diode is connected.

The foregoing description is made on the specific constructions of the ON-driving element 13 and the OFF-driving element 14. The same constructions may be applied to the first control element 23 and the second control element 24. The circuit construction of the pair of driving elements 13, 14 and the circuit construction of the pair of control elements 23, 24 are not necessarily required to be identical to each other, and any combination of the circuit constructions shown in FIGS. 27A to 27D can be adopted. However, it is most desirable that the pair of driving elements 13, 14 and the pair of control elements 23, 24 are constructed by using the circuit construction shown in FIG. 27A.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A gate driving circuit comprising:
    a driving element unit comprising an ON-driving element serving as a switching element for applying an ON-voltage to a gate of a driving target device serving as a switching element so that the driving target device is set to ON-state, and an OFF-driving element serving as a switching element for applying an OFF-voltage to the gate of the driving target device so that the driving target device is set to OFF-state, the ON-driving element and the OFF-driving element being connected to each other in series and the gate of the driving target device being connected to a connection point between the ON-driving element and the OFF-driving element;
    an auxiliary driving unit having a composite element comprising a reactor and an auxiliary driving element serving as a switching element for controlling current flowing in the reactor, the reactor and the auxiliary driving element being connected to each other in series, and one terminal of the composite element being connected to a connection point between the ON-driving element and the OFF-driving element while the other terminal of the composite element is connected to a driving power source terminal; and
    a driving control unit for:
        turning on the auxiliary driving element to make current flow into the reactor when the driving target device is turned off under a state that only the ON-driving element of the driving element portion is turned on;
        turning on the auxiliary driving element to make current flowing into the reactor when the driving target device is turned on under a state that only the OFF-driving element of the driving element portion is turned on;
        turning off both the ON-driving element and the OFF-driving element constituting the driving element unit, inducing resonance by parasitic capacitance of the gate of the driving target device and the reactor; and
        turning on one of both the elements constituting the driving element unit and then turning on the other element when the gate voltage of the driving target element reaches an ON-voltage or OFF-voltage.

2. The gate driving circuit according to claim 1, wherein anti-parallel diodes are connected to or installed in the ON-driving element and the OFF-driving element, wherein the anti-parallel diode of the ON-driving element is conducted when the gate voltage exceeds the ON-voltage during a predetermined time period, wherein the anti-parallel diode of the OFF-driving element is conducted when the gate voltage decreases below the OFF-voltage during another predetermined time period.

3. The gate driving circuit according to claim 1, wherein an intermediate voltage which is set to a value between the ON-voltage and the OFF-voltage is applied to one terminal of the auxiliary driving unit.

4. The gate driving circuit according to claim 1, wherein
    one terminal of the reactor is connected to the connection point between the ON-driving element and the OFF-driving element,
    the auxiliary driving unit comprises a first control element serving as a switching element which is connected to the other terminal of the reactor and applies the ON-voltage and a second control element serving as a switching element which is connected to the other terminal of the reactor and applies the OFF-voltage, and the driving control unit turns on the second control element to make current flow into the reactor when the driving target device is turned off under a state that only the ON-driving element of the driving element portion is turned on, and turns on the first control element to make current flowing into the reactor when the driving target device is turned on under a state that only the OFF-driving element of the driving element portion is turned on, turning off both the ON-driving element and the OFF-driving element constituting the driving element unit, inducing resonance by parasitic capacitance of the gate of the driving target device and the reactor, turning off one of both the elements constituting the driving element unit and then turning on the other element when the gate voltage of the driving target element reaches an ON-voltage or OFF-voltage.

5. The gate driving circuit according to claim 4, wherein anti-parallel diodes are connected to or installed in the first control element and the second control element.

6. The gate driving circuit according to claim 1, wherein
    an intermediate voltage which is set to a value between the ON-voltage and the OFF-voltage is applied to one terminal of the reactor,
    the auxiliary driving unit comprises a switching element which is connected to the other terminal of the reactor.

7. The gate driving circuit according to claim 6, wherein anti-parallel diodes are connected to or installed in the ON-driving element and the OFF-driving element, wherein the anti-parallel diode of the ON-driving element is conducted when the gate voltage exceeds the ON-voltage during a predetermined time period, wherein the anti-parallel diode of the OFF-driving element is conducted when the gate voltage decreases below the OFF-voltage during another predetermined time period.

* * * * *